(12) United States Patent
Kuo et al.

(10) Patent No.: US 8,953,115 B2
(45) Date of Patent: *Feb. 10, 2015

(54) FLAT PANEL DISPLAY DEVICE, STEREOSCOPIC DISPLAY DEVICE, AND PLASMA DISPLAY DEVICE

(75) Inventors: Yi-Cheng Kuo, Shenzhen (CN); Yu-Chun Hsiao, Shenzhen (CN); Chong Huang, Shenzhen (CN); Jia-He Cheng, Shenzhen (CN); Cheng-Wen Que, Shenzhen (CN); Quan Li, Shenzhen (CN); Liu-Yang Yang, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 402 days.

This patent is subject to a terminal disclaimer.

(21) Appl. No.: 13/381,924

(22) PCT Filed: Nov. 24, 2011

(86) PCT No.: PCT/CN2011/082812
§ 371 (c)(1),
(2), (4) Date: Dec. 31, 2011

(87) PCT Pub. No.: WO2013/071626
PCT Pub. Date: May 23, 2013

(65) Prior Publication Data
US 2013/0128544 A1 May 23, 2013

(30) Foreign Application Priority Data
Nov. 18, 2011 (CN) .......................... 2011 1 0366161

(51) Int. Cl.
| | | |
|---|---|---|
| G02F 1/1333 | (2006.01) | |
| F21V 8/00 | (2006.01) | |
| G06F 1/16 | (2006.01) | |
| H04N 13/04 | (2006.01) | |
| H05K 5/02 | (2006.01) | |
| H05K 7/20 | (2006.01) | |
| G02F 1/1335 | (2006.01) | |

(52) U.S. Cl.
CPC ............ *G02B 6/0086* (2013.01); *G06F 1/1601* (2013.01); *H04N 13/04* (2013.01);
(Continued)

(58) Field of Classification Search
CPC .............. G02F 1/133308; G02F 2001/133308; G02F 2001/133314
USPC ........................................................ 349/58–60
See application file for complete search history.

(56) References Cited

U.S. PATENT DOCUMENTS

2007/0217223 A1* 9/2007 Ha et al. ........................ 362/614
2010/0060601 A1* 3/2010 Oohira ........................... 345/173
(Continued)

FOREIGN PATENT DOCUMENTS

| CN | 101109862 A | 1/2008 |
|---|---|---|
| CN | 101150942 A | 3/2008 |

(Continued)

*Primary Examiner* — Richard Kim
*Assistant Examiner* — Kendrick Hsu
(74) *Attorney, Agent, or Firm* — Cheng-Ju Chiang

(57) ABSTRACT

The present invention provides a flat panel display device, which includes a backlight system and a display panel. The backlight system includes a light source, a light homogenization mechanism, and a back frame. The back frame carries the light source and the light homogenization mechanism, and the light homogenization mechanism guides light from the light source into the display panel. The back frame includes primary assembling pieces, secondary assembling pieces, and a bracing piece for fixing a circuit board. The primary assembling pieces are connected through joining and use different thermally conductive materials. Further, the primary assembling piece includes a joint section that forms a reinforcement structure and a circuit board is mountable through a bracing piece. The present invention also provides a backlight system. The back frame and the backlight system of the present invention have a back frame of simple structure, reduce the expenditure of a back frame mold, facilitate heat dissipation, allow strength of the back frame to meet a desired requirement, improve fixing of circuit board, and save the material used for back frame so as to lower down the manufacturing cost of flat panel display device.

19 Claims, 16 Drawing Sheets

(52) U.S. Cl.
CPC ............ *H05K 5/02* (2013.01); *H05K 7/20963*
(2013.01); *G02F 2201/46* (2013.01); *G02F*
*1/133615* (2013.01); *G02F 2001/133325*
(2013.01); *G02F 2001/133328* (2013.01); *G02F*
*2001/133314* (2013.01)
USPC .............................................. 349/58; 349/60

(56) References Cited

U.S. PATENT DOCUMENTS

| | | | |
|---|---|---|---|
| 2010/0172154 A1* | 7/2010 | Takeuchi et al. | 362/613 |
| 2010/0271845 A1* | 10/2010 | Chiu et al. | 362/633 |
| 2011/0002105 A1* | 1/2011 | Miyazaki | 361/749 |
| 2011/0199548 A1* | 8/2011 | Takama | 349/15 |

FOREIGN PATENT DOCUMENTS

| | | |
|---|---|---|
| CN | 201075299 Y | 6/2008 |
| CN | 201672468 U | 12/2010 |
| CN | 201757332 U | 3/2011 |
| CN | 102200259 A | 9/2011 |
| CN | 202033550 U | 11/2011 |
| CN | 102402054 A | 4/2012 |
| CN | 202332136 U | 7/2012 |
| JP | 2006-85125 A | 3/2006 |

* cited by examiner

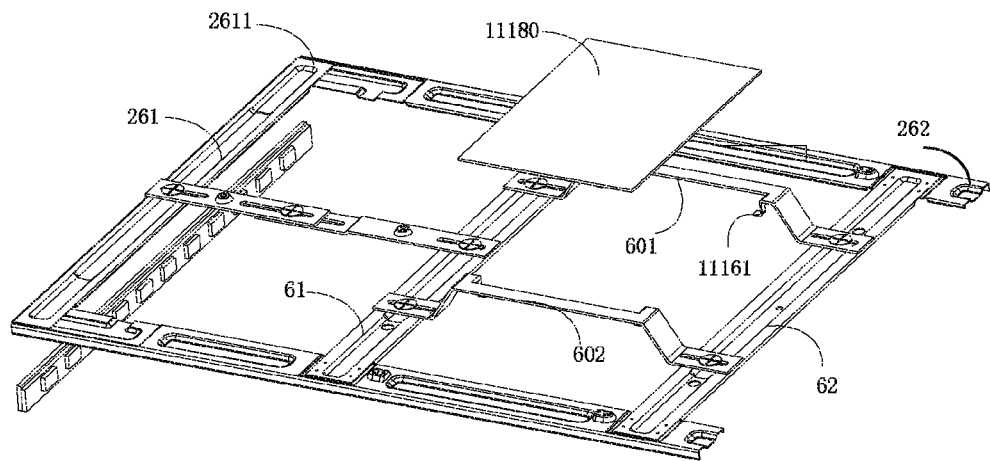

FIG.29

| Manufacturing at least two primary assembling pieces, the at least two primary assembling pieces comprising a primary assembling piece that carries a heat source, the primary assembling piece that carries the heat source has a first heat transfer capability, the remaining one or more primary assembling pieces of the at least two primary assembling pieces that carry no heat source having a second heat transfer capability, the first heat transfer capability being greater than the second heat transfer capability | 501 |

| Joining the at least two primary assembling pieces | 502 |

FIG.30

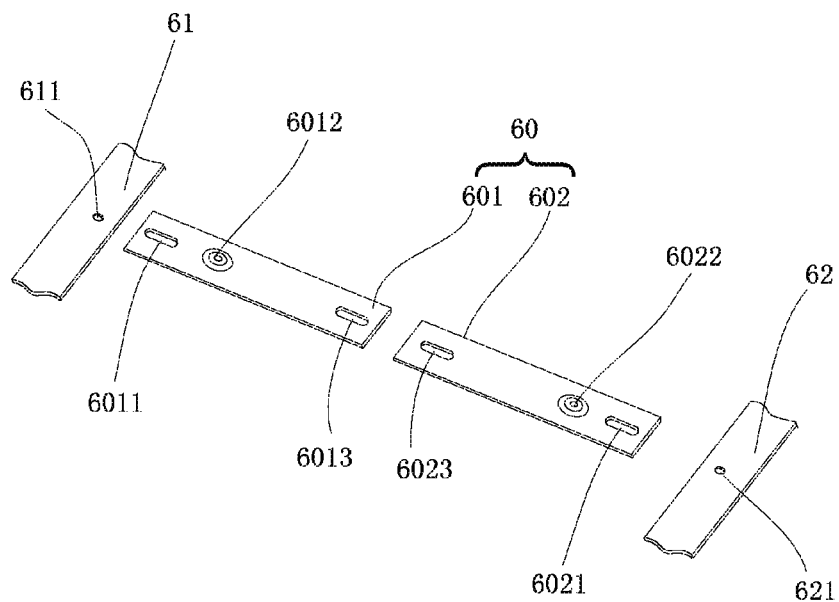
FIG.34
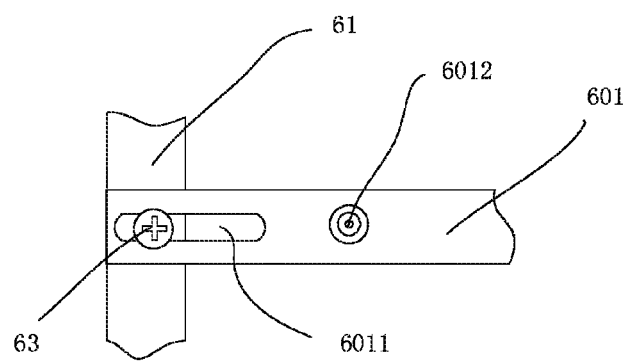
FIG.35
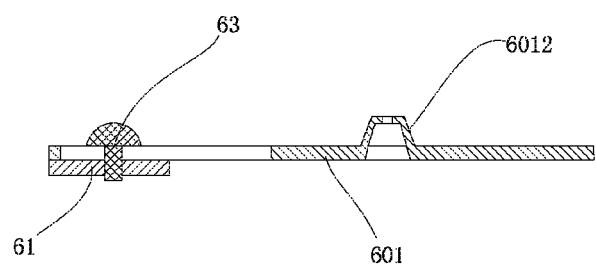
图 36

FLAT PANEL DISPLAY DEVICE, STEREOSCOPIC DISPLAY DEVICE, AND PLASMA DISPLAY DEVICE

BACKGROUND OF THE INVENTION

1. Field of the Invention

The present invention relates to the field of displaying techniques, and in particular to a flat panel display device, a stereoscopic display device, and a plasma display device.

2. The Related Arts

The state-of-the-art liquid crystal display device comprises a front bezel, a panel, and a backlight module, of which the backlight module comprises a back frame, a reflector plate, a light guide, and a lighting assembly.

Currently, a variety of display panels of different sizes are available in the market to meet different needs of general consumers. For example, in the field of television set, the sizes of liquid crystal panels include 31.5, 42, 46, 48, and 55 inches. Different back frame molds are provided for liquid crystal planes of different sizes.

Referring to FIG. 1, FIG. 1 is a schematic view showing a conventional back frame of liquid crystal display device. As shown in FIG. 1, the conventional back frame 10 is a unitary back frame, and it is often that a unitary back frame 10 is made with metal stamping or plastic injection molding. The unitary back frame 10 consumes much material and has a high material cost. Further, a large-sized back frame 10 requires large-sized stamping equipment, and the size of mold corresponding to such a back frame 10 is large and the structure complicated, making the expenditure of the back frame mold high. As a consequence, the conventional back frame is of a high cost.

SUMMARY OF THE INVENTION

The technical issue to be addressed by the present invention is to provide a flat panel display device, a stereoscopic display device, and a plasma display device, which lower down material cost and mold cost, facilitate heat dissipation, allow the strength of the back frame to meet a desired requirement, and improve fixing of circuit board.

To address the above technical issue, the present invention adopts a technical solution that provides a flat panel display device, which comprises a backlight system and a display panel; the backlight system comprises a light source, a light homogenization mechanism, and a back frame; the back frame carries the light source and the light homogenization mechanism, the light homogenization mechanism guiding light from the light source into the display panel; the back frame comprises primary assembling pieces, secondary assembling pieces, and a bracing piece for fixing a circuit board; the primary assembling pieces have a number of at least two, at least one of the primary assembling pieces having an end forming a joint section, the at least two primary assembling pieces being joined through the corresponding joint sections, the secondary assembling pieces being connected to the primary assembling pieces through joining; at least one of the primary assembling pieces comprises a reinforcement structure formed on the joint section thereof; the at least two primary assembling pieces comprise a primary assembling piece that has a heat source arranged thereon, the primary assembling piece that has the heat source arranged thereon having a first heat transfer capability, the remaining one or more primary assembling pieces of the at least two primary assembling pieces that have no heat source arranged thereon having a second heat transfer capability, the first heat transfer capability being greater than the second heat transfer capability; the bracing piece comprises a bracing body, a first suspension section, a first bearing section, and a first resilient bent section, the bracing body being fixed to the primary assembling pieces or the secondary assembling pieces or both of the primary assembling pieces and the secondary assembling pieces; and the first suspension section extends from the bracing body in a lengthwise direction of the bracing body, the first bearing section being spaced from the bracing body and extending from the first suspension section in a lengthwise direction of the first suspension section, the first resilient bent section being located between the first bearing section and the bracing body and being bent from the first suspension section in a lengthwise direction of the first suspension section, the first bearing section and the first resilient bent section resiliently clamping a first side edge of the circuit board.

According to a preferred embodiment of the present invention, the at least two primary assembling pieces comprises a first primary assembling piece and a second primary assembling piece.

According to a preferred embodiment of the present invention, the joint sections comprise recesses formed in a surface of the first primary assembling piece and having a shape corresponding to the end of the second primary assembling piece for receiving the end of the second primary assembling piece.

According to a preferred embodiment of the present invention, the first primary assembling piece forms a first through hole in a bottom thereof, a second through hole being formed in the second primary assembling piece at a corresponding position, the back frame comprising a fastener, the fastener extending through the first through hole and the second through hole to joint the first primary assembling piece and the second primary assembling piece.

According to a preferred embodiment of the present invention, the joint sections comprise recesses formed in the surface of the first primary assembling piece, the second primary assembling piece having an end having a surface forming protrusions at corresponding positions, the protrusions being receivable in the recesses to join the first primary assembling piece and the second primary assembling piece to each other.

According to a preferred embodiment of the present invention, each of the primary assembling pieces has a cross-section of the joint section that has a line-folded configuration in order to form the reinforcement structure, the line-folded configuration comprising at least two joined line segments, the reinforcement structures of the two primary assembling pieces being stacked in a recess-projection paired form.

According to a preferred embodiment of the present invention, each of the primary assembling pieces has a cross-section of the joint section that is an arc shape to form the reinforcement structure, the reinforcement structures of the two primary assembling pieces being stacked in a recess-projection paired form.

According to a preferred embodiment of the present invention, the primary assembling piece that has the heat source arranged thereon has a first strength, the remaining one or more primary assembling pieces of the at least two primary assembling pieces that have no heat source arranged thereon having a second strength, the second strength being greater than the first strength.

According to a preferred embodiment of the present invention, the primary assembling piece that has the first heat transfer capability and the first strength is an aluminum piece and the primary assembling pieces that have the second heat transfer capability and the second strength are galvanized steel pieces.

According to a preferred embodiment of the present invention, the bracing body forms at least two through holes that are spaced in the lengthwise direction of the bracing body, the secondary assembling piece being mountable to any one of the at least two through holes and the bracing body being fixed to the secondary assembling piece.

According to a preferred embodiment of the present invention, the bracing piece comprises at least two bracing members, wherein at least one of the bracing members is mountable to the primary assembling piece in a lengthwise of the primary assembling piece and the other one of the bracing members forms at least two through hole that are spaced in the lengthwise direction of the bracing piece, the primary assembling piece being mountable to any one of the at least two through holes.

According to a preferred embodiment of the present invention, the bracing piece further comprises a second suspension section, a second bearing section, and a second resilient bent section, the second suspension section being spaced from the first suspension section and extending from the bracing body in a lengthwise direction of the bracing body, the second bearing section being spaced from the bracing body and extending from the second suspension section in a lengthwise direction of the second suspension section, the second resilient bent section being located between the second bearing section and the bracing body and extending from the second suspension in a lengthwise direction of the second suspension section, the second bearing section and the second resilient bent section resiliently clamping the circuit board.

According to a preferred embodiment of the present invention, the two bracing members clamp different positions of a first side edge and a second side edge of the circuit board.

According to a preferred embodiment of the present invention, the bracing body is of a step-like configuration and bridges between two of the primary assembling pieces, or two of the secondary assembling pieces, or between the primary assembling piece and the secondary assembling piece.

According to a preferred embodiment of the present invention, the back frame comprises a third primary assembling piece and a fourth primary assembling piece; and the first primary assembling piece, the second primary assembling piece, the third primary assembling piece, and the fourth primary assembling piece are straight linear and are joined in a leading end-to-tailing end manner to form a rectangular main frame structure enclosing the back frame.

According to a preferred embodiment of the present invention, the secondary assembling pieces comprise a first secondary assembling piece and a second secondary assembling piece, the first secondary assembling piece having two ends respectively joined to at least two primary assembling pieces of the first primary assembling piece, the second primary assembling piece, the third primary assembling piece, and the fourth primary assembling piece, the second secondary assembling piece having two ends respectively joined to at least two primary assembling pieces of the first primary assembling piece, the second primary assembling piece, the third primary assembling piece, and the fourth primary assembling piece.

According to a preferred embodiment of the present invention, the two ends of the first secondary assembling piece are respectively joined to the first primary assembling piece and the second primary assembling piece that are adjacent to each other and the two ends of the second secondary assembling piece are respectively joined to the third primary assembling piece and the fourth primary assembling piece that are adjacent to each other; or the two ends of the first secondary assembling piece are respectively joined to the first primary assembling piece and the third primary assembling piece that are opposite to each other and the two ends of the second secondary assembling piece are respectively joined to the first primary assembling piece and the third primary assembling piece that are opposite to each other, the second primary assembling piece, the fourth primary assembling piece, the first secondary assembling piece, and the second secondary assembling piece being arranged parallel to each other.

According to a preferred embodiment of the present invention, the back frame comprises at least one bracing piece, which is releasably fixed to one or more of the first primary assembling piece, the second primary assembling piece, the third primary assembling piece, the fourth primary assembling piece, the first secondary assembling piece, and the second secondary assembling piece, the bracing piece forming a bump.

According to a preferred embodiment of the present invention, the flat panel display device comprises a touch screen and the touch screen is positioned on a light exit surface of the display panel.

To address the above technical issue, the present invention adopts a technical solution that provides a stereoscopic display device. The stereoscopic display device comprises a liquid crystal lens grating, a backlight system, and a display panel, the liquid crystal lens grating being arranged on a light exit surface of the display panel; the backlight system comprises a light source, a light homogenization mechanism, and a back frame; the back frame carries the light source and the light homogenization mechanism, the light homogenization mechanism guiding light from the light source to a light incidence surface of the display panel; the back frame comprises primary assembling pieces, secondary assembling pieces, and a bracing piece for fixing a circuit board; the primary assembling pieces have a number of at least two, at least one of the primary assembling pieces having an end forming a joint section, the at least two primary assembling pieces being joined through the corresponding joint sections, the secondary assembling pieces being connected to the primary assembling pieces through joining; at least one of the primary assembling pieces comprises a reinforcement structure formed on the joint section thereof; the at least two primary assembling pieces comprise a primary assembling piece that has a heat source arranged thereon, the primary assembling piece that has the heat source arranged thereon having a first heat transfer capability, the remaining one or more primary assembling pieces of the at least two primary assembling pieces that have no heat source arranged thereon having a second heat transfer capability, the first heat transfer capability being greater than the second heat transfer capability; the bracing piece comprises a bracing body, a first suspension section, a first bearing section, and a first resilient bent section, the bracing body being fixed to the primary assembling pieces or the secondary assembling pieces or both of the primary assembling pieces and the secondary assembling pieces; and the first suspension section extends from the bracing body in a lengthwise direction of the bracing body, the first bearing section being spaced from the bracing body and extending from the first suspension section in a lengthwise direction of the first suspension section, the first resilient bent section being located between the first bearing section and the bracing body and being bent from the first suspension section in a lengthwise direction of the first suspension section, the first bearing section and the first resilient bent section resiliently clamping a first side edge of the circuit board.

To address the above technical issue, the present invention adopts a technical solution that provides a plasma display device, which comprises a plasma display panel and a back frame, the back frame being arranged at a back side of the plasma display panel; the back frame comprises primary assembling pieces, secondary assembling pieces, and a bracing piece for fixing a circuit board; the primary assembling pieces have a number of at least two, at least one of the primary assembling pieces having an end forming a joint section, the at least two primary assembling pieces being joined through the corresponding joint sections, the secondary assembling pieces being connected to the primary assembling pieces through joining; at least one of the primary assembling pieces comprises a reinforcement structure formed on the joint section thereof; the at least two primary assembling pieces comprise a primary assembling piece that has a heat source arranged thereon, the primary assembling piece that has the heat source arranged thereon having a first heat transfer capability, the remaining one or more primary assembling pieces of the at least two primary assembling pieces that have no heat source arranged thereon having a second heat transfer capability, the first heat transfer capability being greater than the second heat transfer capability; the bracing piece comprises a bracing body, a first suspension section, a first bearing section, and a first resilient bent section, the bracing body being fixed to the primary assembling pieces or the secondary assembling pieces or both of the primary assembling pieces and the secondary assembling pieces; and the first suspension section extends from the bracing body in a lengthwise direction of the bracing body, the first bearing section being spaced from the bracing body and extending from the first suspension section in a lengthwise direction of the first suspension section, the first resilient bent section being located between the first bearing section and the bracing body and being bent from the first suspension section in a lengthwise direction of the first suspension section, the first bearing section and the first resilient bent section resiliently clamping a first side edge of the circuit board.

The efficacy of the present invention is that to be distinguished from the state of the art, the present invention provides a flat panel display device, a stereoscopic display device, and a plasma display device that comprises at least two primary assembling pieces. The joint section of the primary assembling piece forms a reinforcement structure in order to improve the strength of joining. The primary assembling pieces use different thermally conductive materials. Further, a circuit board is mountable through a bracing piece so that a mold for back frame is made simple in structure, the expenditures of the back frame mold and the back frame are reduced, the strength of the back frame can meet a desired requirement, heat dissipation is facilitated, fixing of circuit board is improved, and the manufacturing cost of flat panel display device is reduced.

BRIEF DESCRIPTION OF THE DRAWINGS

FIG. 29 is a schematic view showing a back frame of flat panel display device;

FIG. 30 is a flow chart showing a method for manufacturing a back frame of a flat panel display device according to a sixteenth of the present invention;

FIG. 34 is a schematic view showing a portion of a back frame of a flat panel display device according to a twentieth embodiment of the present invention;

FIG. 35 is an enlarged view showing a mounting site of a bracing member of a back frame and an assembling piece shown in FIG. 34;

FIG. 36 is a cross-sectional view showing the mounting site of the bracing member of the back frame and the assembling piece shown in FIG. 34;

DETAILED DESCRIPTION OF THE PREFERRED EMBODIMENTS

Figure 1:
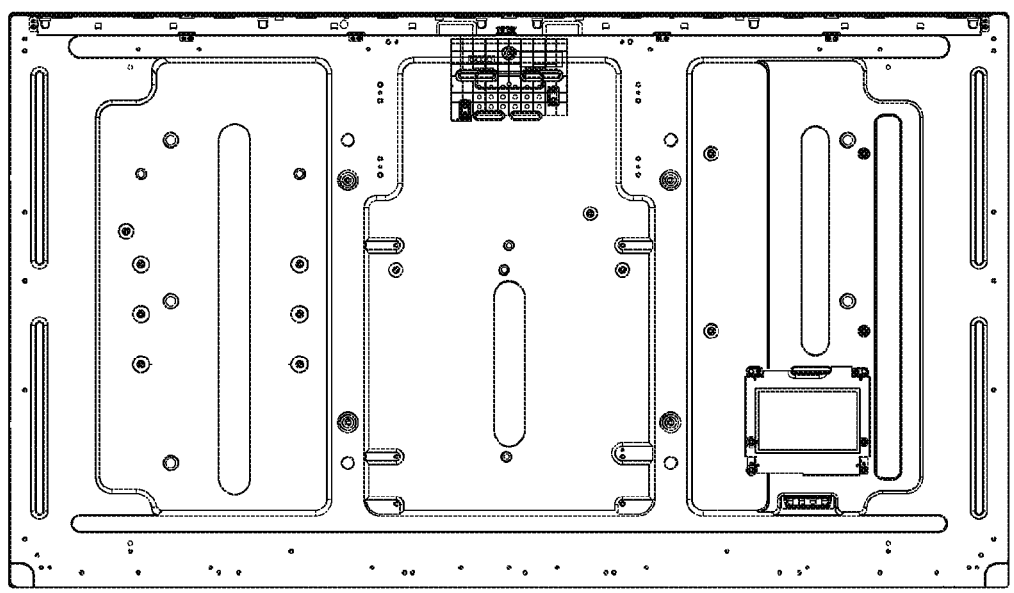
FIG. 1 is a schematic view showing a conventional back frame of liquid crystal display device.
Figure 2:
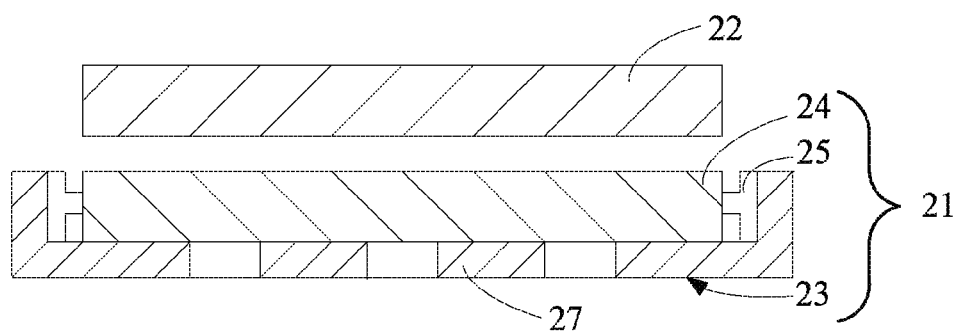
FIG. 2 is a schematic view showing a flat panel display device according to a first embodiment of the present invention.
Figure 3:
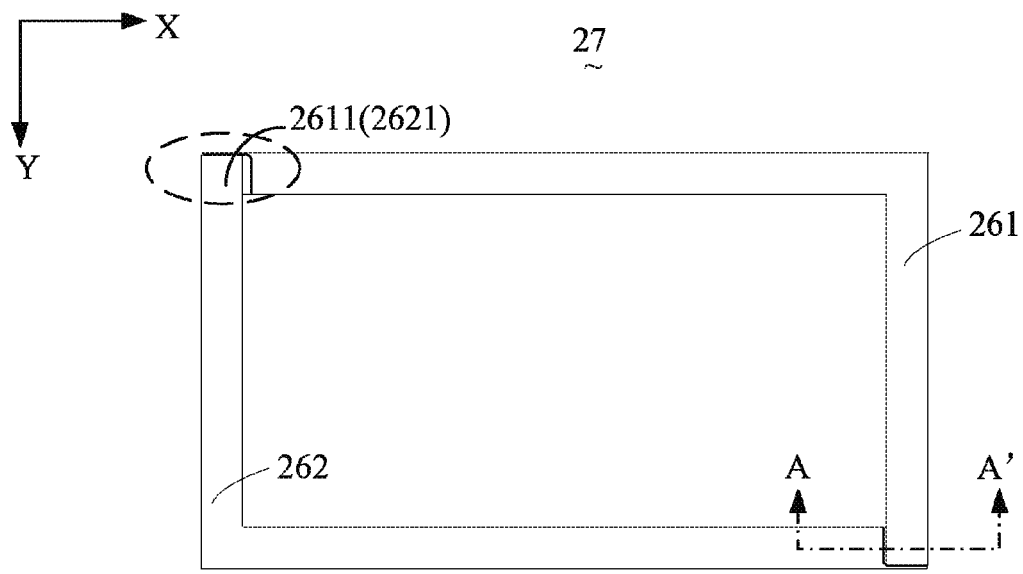
FIG. 3 is a schematic view showing a back frame of a flat panel display device according to a second embodiment of the present invention.

Referring to FIGS. 2-3, FIG. 2 is a schematic view showing a flat panel display device according to a first embodiment of the present invention and FIG. 3 is a schematic view showing a back frame of a flat panel display device according to a second embodiment of the present invention. As shown in FIG. 2, the flat panel display device 20 according to the instant embodiment comprises: a backlight system 21 and a display panel 22. The backlight system 21 is arranged on a back side of the display panel 22 and supplies light to the display panel 22.

In the instant embodiment, the backlight system 21 comprises a light source 25, a light homogenization mechanism 24, and a back frame 23. The back frame 23 carries the light source 25 and the light homogenization mechanism 24. When the backlight system 21 is an edge lighting type, the light homogenization mechanism 24 is a light guide; and when the backlight system 21 is a direct type, the light homogenization mechanism 24 is a diffuser plate. The back frame 23 comprises at least a first primary assembling piece and a second primary assembling piece, and the two of at least first and second primary assembling pieces constitute a main frame structure 27 of the back frame 23.

Referring also to FIG. 3, the back frame 23 of the first embodiment comprises a first primary assembling piece 261 and a second primary assembling piece 262. The first primary assembling piece 261 has an end joined to an end of the second primary assembling piece 262, and the first primary assembling piece 261 has another end joined to another end of the second primary assembling piece 262 in order to form the main frame structure 27 of the back frame 23. The first primary assembling piece 261 and the second primary assembling piece 262 are both aluminum pieces or galvanized steel pieces. In the instant embodiment, the first primary assembling piece 261 and the second primary assembling piece 262 are L-shaped.

Further referring to FIG. 3, in the instant embodiment, the first primary assembling piece 261 comprises a joint section 2611 and the second primary assembling piece 262 comprises a joint section 2612. At least one of the first primary assembling piece 261 and the second primary assembling piece 262 comprises a reinforcement structure on the joint section thereof. In other words, the reinforcement structure is arranged on at least the joint section 2611 or the joint section 2612.

An example that the joint section 2611 and the joint section 2612 are both provided with a reinforcement structure will be described.

Figure 4:
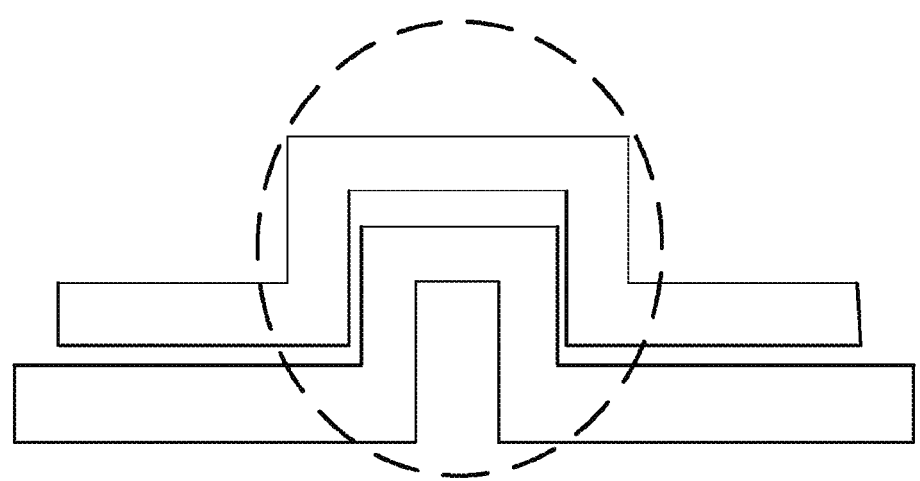
FIG. 4 is a cross-sectional view of a first embodiment of a joint section of a primary assembling piece taken along line A-A' of FIG. 3.
Figure 5:
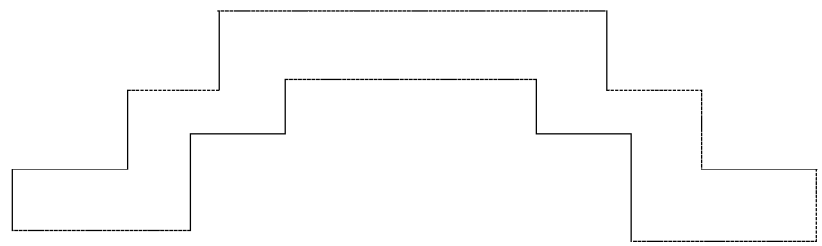
FIG. 5 is a cross-sectional view of a second embodiment of a joint section of a primary assembling piece taken along line A-A' of FIG. 3.
Figure 6:
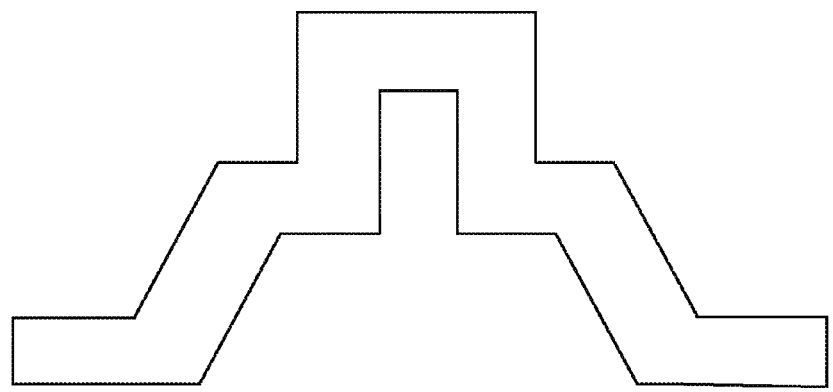
FIG. 6 is a cross-sectional view of a third embodiment of a joint section of a primary assembling piece taken along line A-A' of FIG. 3.
Figure 7:
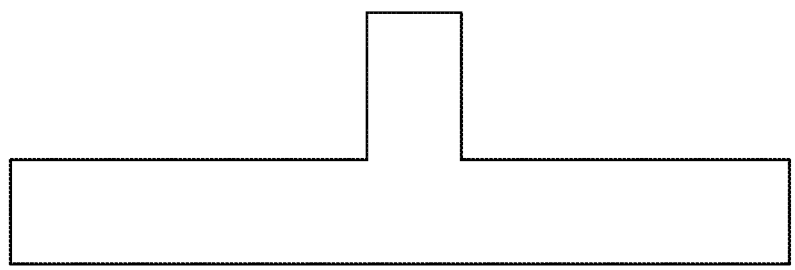
FIG. 7 is a cross-sectional view of a fourth embodiment of a joint section of a primary assembling piece taken along line A-A' of FIG. 3.
Figure 8:
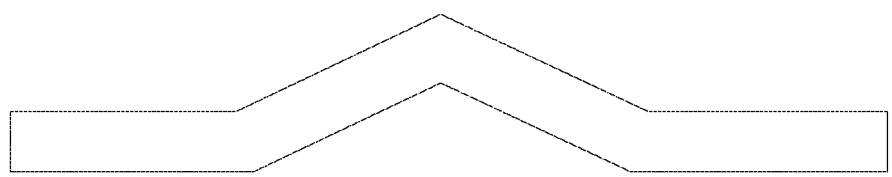
FIG. 8 is a cross-sectional view of a fifth embodiment of a joint section of a primary assembling piece taken along line A-A' of FIG. 3.
Figure 9:
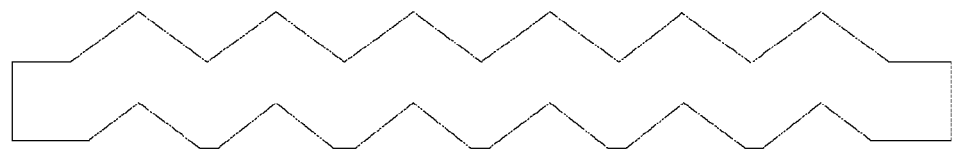
FIG. 9 is a cross-sectional view of a sixth embodiment of a joint section of a primary assembling piece taken along line A-A' of FIG. 3.
Figure 10:
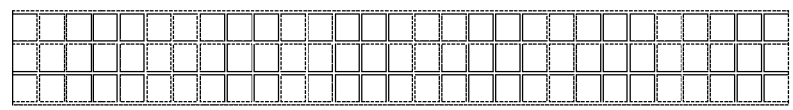
FIG. 10 is a cross-sectional view of a seventh embodiment of a joint section of a primary assembling piece taken along line A-A' of FIG. 3.

The joint section 2611 and the joint section 2612 have a cross-section that has a line-folded configuration in order to form a reinforcement structure. The line-folded configuration comprises at least two joined line segments. For example, the line-folded configuration of the reinforcement structure may be a rectangle (as shown in FIG. 4, in which circled by phantom lines is a stacked recess-projection paired form), a trapezoidal (as shown in FIG. 5), a swallow-tailed shape (as shown in FIG. 6), an inverted T-shape (as shown in FIG. 7), a conic shape (as shown in FIG. 8), a wavy shape (as shown in FIG. 9), a grating shape (as shown in FIG. 10), or may alternatively be a T-shape, a cruciform shape, or a fork-like shape. The reinforcement structure of the joint section 2611 of the first primary assembling piece 261 and the reinforcement structure of the joint section 2621 of the second primary assembling piece 262 are stacked in a recess-projection paired form.

Figure 11:
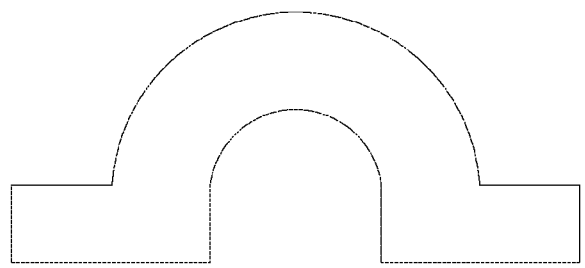
FIG. 11 is a cross-sectional view of an eighth embodiment of a joint section of a primary assembling piece taken along line A-A' of FIG. 3.
Figure 12:
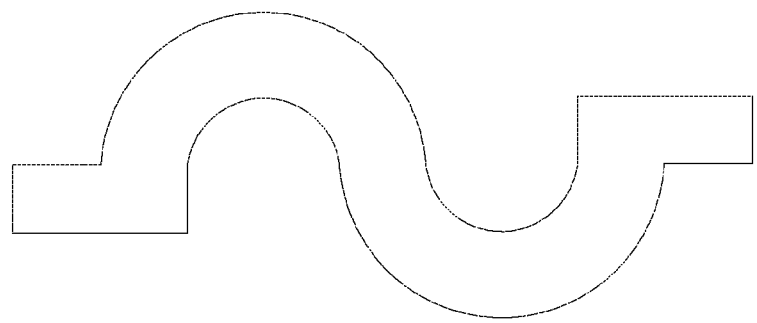
FIG. 12 is a cross-sectional view of a ninth embodiment of a joint section of a primary assembling piece taken along line A-A' of FIG. 3.
Figure 13:
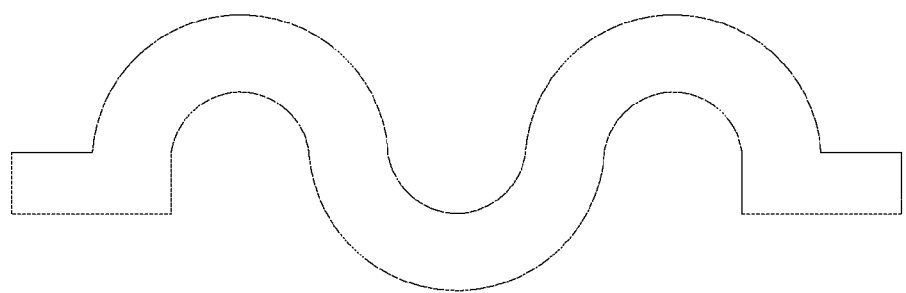
FIG. 13 is a cross-sectional view of a tenth embodiment of a joint section of a primary assembling piece taken along line A-A' of FIG. 3.

Alternatively, the joint section 2611 and the joint section 2621 may have a cross-section that is an arc shape to form the reinforcement structure. When the cross-section is an arc shape, the arc shape can be one or more groups of single curvature (as shown in FIG. 11), dual curvatures (as shown in FIG. 12) or multiple curvatures (as shown in FIG. 13). The reinforcement structure of the joint section 2611 of the first primary assembling piece 261 and the reinforcement structure of the joint section 2621 of the second primary assembling piece 262 are stacked in a recess-projection paired form.

It is apparent that the shape of the cross-section that can be used to form a reinforcement structure is not limited to these and any can be used provided the strength of the reinforcement structure is improved. Further, it is noted that in all the embodiments of joint section of primary assembling piece shown in FIGS. 5-13, except FIG. 5 showing the shapes of the reinforcement structure of the joint section 2611 and the reinforcement structure of the joint section 2621 and the recess-projection stacking between the two reinforcement structures, the remaining drawings show only the shape of the reinforcement structure of one of the joint section 2611 or 2612 and the recess-projection stacking is not illustrated.

Figure 14:
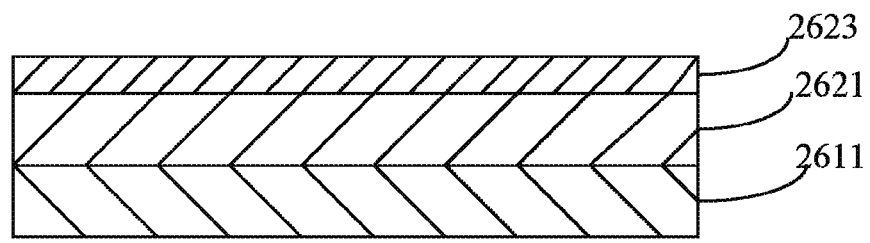
FIG. 14 is a schematic view showing another structure of the reinforcement structure of the back frame shown in FIG. 3.

Referring to FIG. 14, which is a schematic view showing another structure of the reinforcement structure provided on the joint section 2621, the reinforcement structure comprises a plate layer 2623. The plate layer 2623 functions to thicken the joint section 2621, with the joint section 2611 being stacked on the joint section 2621.

It is appreciated that the embodiments of the present invention employ a joining operation to form a back frame in order to simplify the structure of the back frame and save the material used for the back frame so as to reduce the manufacturing cost of a backlight display device. Meanwhile, through the arrangement of reinforcement structure on a joint section of a primary assembling piece, the strength of the joint site of the back frame can be improved to thereby ensure the overall strength of the back frame meets desired requirement.

It is noted all the embodiments of the reinforcement structure described above are also applicable to various embodiments of back frame, backlight system, and flat panel display device.

Figure 15:
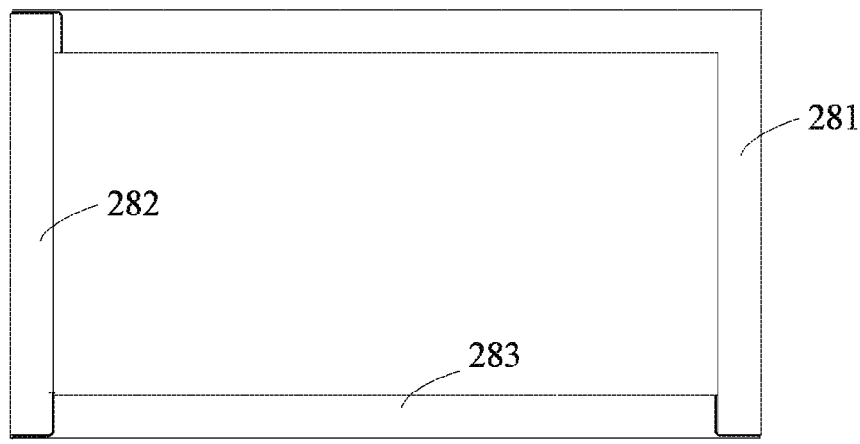
FIG. 15 is a schematic view showing a back frame of a flat panel display device according to a third embodiment of the present invention.

Referring also to FIG. 15, the back frame 23 of a second embodiment comprises a first primary assembling piece 281, a second primary assembling piece 282, and a third primary assembling piece 283. The three primary assembling pieces 281, 282, and 283 are assembled and joined to form a main frame structure 27 of the back frame 23. The three primary assembling pieces 281, 282, and 283 are all aluminum pieces or galvanized steel pieces. In the instant embodiment, the first primary assembling piece 281 is L-shaped, and the second and third primary assembling pieces 282, 283 are straight linear.

Further, the back frame 23 further comprises secondary assembling pieces arranged inside and joined to the main frame structure 27.

A detailed description will be given to the back frame 23 of the flat panel display device 20 according to the present invention, which comprises four primary assembling pieces and two secondary assembling pieces.

Figure 16:
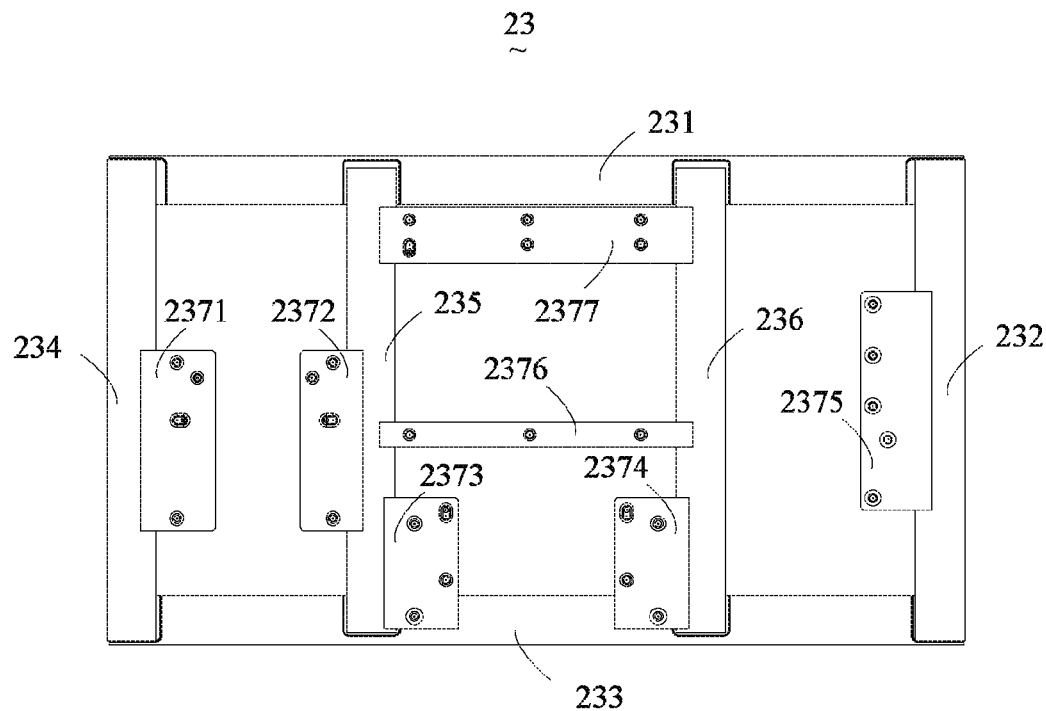
FIG. 16 is a schematic view showing a back frame of a flat panel display device according to a fourth embodiment of the present invention.

Referring to FIG. 16, FIG. 16 is a schematic view showing a back frame of flat panel display device according to a fourth embodiment of the present invention. As shown in FIG. 16, in the instant embodiment, a back frame 23 comprises: a first primary assembling piece 231, a second primary assembling piece 232, a third primary assembling piece 233, a fourth primary assembling piece 234, a first secondary assembling piece 235, a second secondary assembling piece 236, and bracing pieces 2371, 2372, 2373, 2374, 2375, 2376, and 2377. The first primary assembling piece 231, the second primary assembling piece 232, the third primary assembling piece 233, and the fourth primary assembling piece 234 are successively joined to each other in an end-to-end manner to constitute a rectangular main frame structure 27 of the back frame 23. The first secondary assembling piece 235 and the second secondary assembling piece 236, serving as ancillary assembling pieces, are arranged in the main frame structure 27 and joined to the main frame structure 27.

Specifically, an end of the first primary assembling piece 231 is joined to an end of the second primary assembling piece 232, another end of the second primary assembling piece 232 is joined to an end of the third primary assembling piece 233, another end of the third primary assembling piece 233 is joined to an end of the fourth primary assembling piece 234, and another end of the fourth primary assembling piece 234 is joined to another end of the first primary assembling piece 231 in order to form the rectangular main frame structure 27. The first primary assembling piece 231, the second primary assembling piece 232, the third primary assembling piece 233, and the fourth primary assembling piece 234 are all aluminum pieces or galvanized steel pieces. In the instant embodiment, the first primary assembling piece 231, the second primary assembling piece 232, the third primary assembling piece 233, and the fourth primary assembling piece 234 are straight linear, yet in other embodiments, it is apparent to those skilled in the art to make all the first primary assembling piece 231, the second primary assembling piece 232, the third primary assembling piece 233, and the fourth primary assembling piece 234 L-shaped, or some being straight linear and the remaining being L-shaped. For example, in FIG. 3, the first primary assembling piece 261 and the second primary assembling piece 262 are both L-shaped; in FIG. 4, the first primary assembling piece 281 is L-shaped, while the second and third primary assembling pieces 282 and 283 are straight linear.

Figure 17:
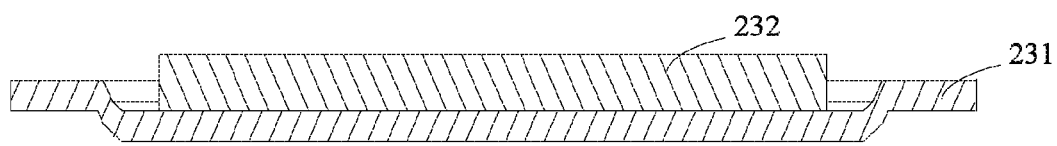
FIG. 17 is a schematic view showing a joining structure of a flat panel display device according to a fifth embodiment of the present invention.
Figure 18:
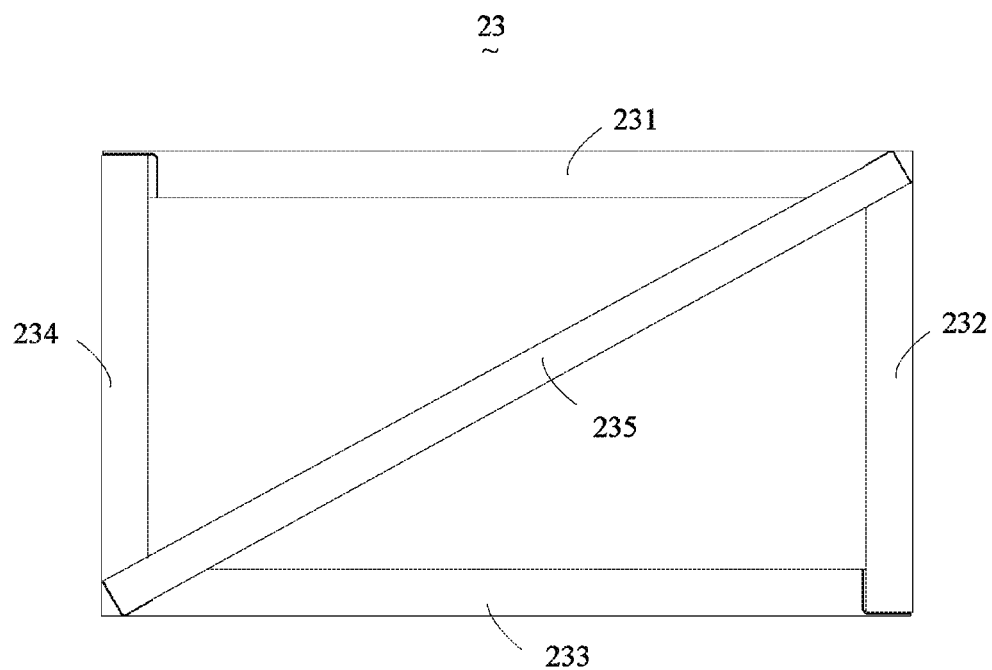
FIG. 18 is a schematic view showing a diagonally-arranged first secondary assembling piece mounted to a main frame structure of a flat panel display device according to a sixth embodiment of the present invention.

In the instant embodiment, the back frame 23 of the flat panel display device 20 is formed by joining connection. As shown in FIG. 17, an illustrative example is given for the connection of an end of the first primary assembling piece 231 to an end of the second primary assembling piece 232, wherein the end of the second primary assembling piece 232 is joined to the end of the first primary assembling piece 231 by means of for example screwing, fastening, or welding, to have the end of the second primary assembling piece 232 connected to the end of the first primary assembling piece 231.

Figure 19:
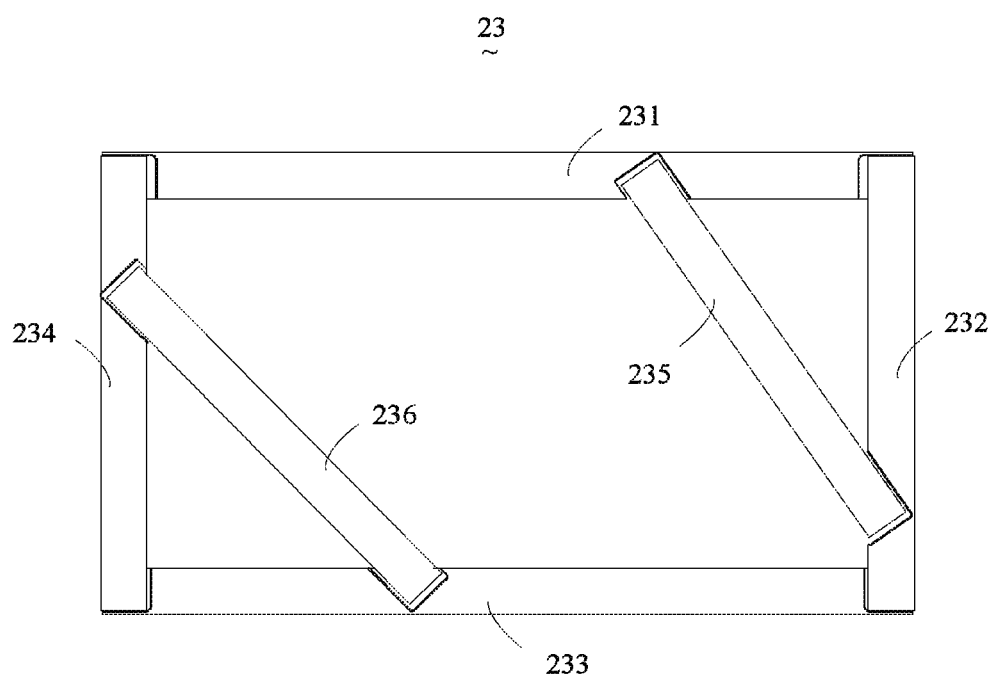
FIG. 19 is a schematic view showing a first secondary assembling piece and a second secondary assembling piece mounted to a main frame structure of a flat panel display device according to a seventh embodiment of the present invention.

In the instant embodiment, the first secondary assembling piece 235 and the second secondary assembling piece 236 are arranged in the main frame structure 27 of the back frame 23. An end of the first secondary assembling piece 235 is joined to the first primary assembling piece 231 and another end of the first secondary assembling piece 235 is joined to the third primary assembling piece 233; and an end of the second secondary assembling piece 236 is joined to the first primary assembling piece 231 and another end of the second secondary assembling piece 236 is joined to the third primary assembling piece 233. Further, the second primary assembling piece 232, the fourth primary assembling piece 234, the first secondary assembling piece 235, and the second secondary assembling piece 236 are arranged parallel to each other. In other embodiments, those skilled in the art may arrange at least one secondary assembling piece in the main frame structure 27. For example, only the first secondary assembling piece 235 is arranged in the main frame structure 27. Further, the two ends of the first secondary assembling piece 235 can be selectively joined to at least two of the primary assembling pieces of the first primary assembling piece 231, the second primary assembling piece 232, the third primary assembling piece 233, and the fourth primary assembling piece 234. For example, the first secondary assembling piece 235 is set diagonally in the main frame structure 27, as shown in FIG. 7. Similarly, the two ends of the second secondary assembling piece 236 can be selectively joined to at least two of the primary assembling pieces of the first primary assembling piece 231, the second primary assembling piece 232, the third primary assembling piece 233, and the fourth primary assembling piece 234. For example, the two ends of the first secondary assembling piece 235 are respectively joined to the first primary assembling piece 231 and the second primary assembling piece 232 that are adjacent to each other and the two ends of the second secondary assembling piece 236 are respectively joined the third primary assembling piece 233 and the fourth primary assembling piece 234 that are adjacent to each other, as shown in FIG. 19.

In the instant embodiment, the back frame 23 comprises seven bracing pieces 2371, 2372, 2373, 2374, 2375, 2376, and 2377. The bracing piece 2371 is fixed to the fourth primary assembling piece 234; the bracing pieces 2372, 2373 are both fixed to the first secondary assembling piece 235; the bracing piece 2374 is fixed to the second secondary assembling piece 236; the bracing piece 2375 is fixed to the second primary assembling piece 232; and the bracing pieces 2376, 2377 are each fixed, at two ends thereof, to the first secondary assembling piece 235 and the second secondary assembling piece 236. In practice, the bracing pieces can be fixed to one or more of the first primary assembling piece 231, the second primary assembling piece 232, the third primary assembling piece 233, the fourth primary assembling piece 234, the first secondary assembling piece 235, and the second secondary assembling piece 236. In other embodiments, those skilled in the art may mount bracing pieces of any other numbers to the back frame 23, such as one or more bracing pieces. Further, the bracing pieces can be releasably fixed to one or more of the first primary assembling piece 231, the second primary assembling piece 232, the third primary assembling piece 233, the fourth primary assembling piece 234, the first secondary assembling piece 235, and the second secondary assembling piece 236.

The bracing pieces 2371, 2372, 2373, 2374, 2375, 2376, and 2377 may be provided with bumps (not labeled) so that the back frame 23 may fix components, such as circuit boards, with such bumps.

Molds for making the back frame 23 will be described. In the instant embodiment, the first primary assembling piece 231 and the third primary assembling piece 233 are of the same size and shape so that they can be made by stamping with the same mold. The second primary assembling piece 232, the fourth primary assembling piece 234, the first secondary assembling piece 235, and the second secondary assembling piece 236 are of the same size and shape so that they can be made by stamping with the same mold, making it possible to share the mold. Thus, the back frame 23 of the present invention can be made by stamping with only two small-sized molds, and compared to the conventional back frame 10 that requires a large-sized mold, the molds for making the back frame 23 of the present invention are simple in structure and small in size and thus the cost of mold for the back frame 23 can be lowered. Further, compared to the whole back frame structure of the conventional back frame 10, the back frame 23 of the present invention can significantly save material used and thus reduce the manufacturing cost of the flat panel display device 20.

Figure 20:
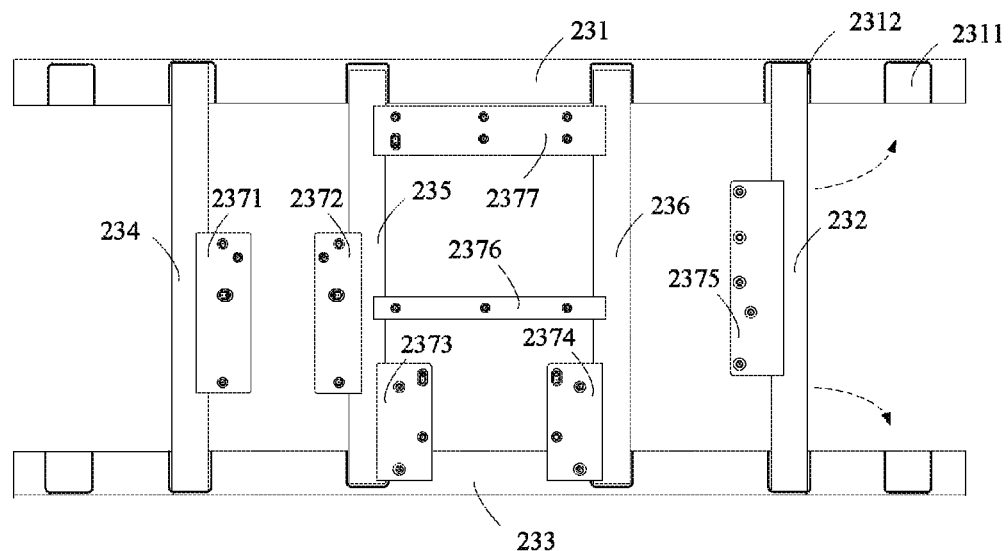
FIG. 20 is a schematic view showing joint sections of a back frame of a flat panel display device according to an eighth embodiment of the present invention.

Referring to FIG. 20, FIG. 20 is a schematic view showing joint sections of a back frame of a flat panel display device according to an eighth embodiment of the present invention. As shown in FIG. 20, in the instant embodiment, an end of the first primary assembling piece is provided with two joint sections, and the joint sections have a structure mating an end of the second primary assembling piece so that the first primary assembling piece can be joined to a corresponding end of the second primary assembling piece.

Figure 21:
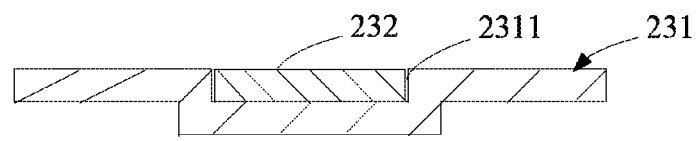
FIG. 21 is a cross-sectional view showing a first embodiment of joint section of FIG. 20.

Specifically, the first primary assembling piece 231 has an end forming joint sections 2311, 2312, and the joint sections 2311, 2312 are arranged in a spaced manner in a lengthwise direction of the first primary assembling piece 231. The joint sections 2311, 2312 are formed by forming recesses having a shape mating an end of the second primary assembling piece 232 in the first primary assembling piece 231 in order to receive the end of the second primary assembling piece 232 therein. As shown in FIG. 21, the joint sections 2311, 2312 are recesses that do not extend through opposite surfaces of the end of the first primary assembling piece 231 and the recesses are of a rectangular shape with the second primary assembling piece 232 being straight linear.

To assemble a large-sized back frame 23, the joint section 2311 that is close to the very end of the first primary assembling piece 231 is first taken and a second primary assembling piece 232 having a corresponding width is selected. Afterwards, an end of the second primary assembling piece 232 is positioned in the recess of the joint section 2311. And then, means, such as screwing, fastening, or welding, is applied to join and fix the end of the second primary assembling piece 232 to the joint section 2311. To assemble a small-sized back frame 23, the joint section 2312 that is distant from the very end of the first primary assembling piece 231 is first chosen and a second primary assembling piece 232 having a corresponding width is selected. Afterwards, an end of the second primary assembling piece 232 is positioned in the recess of the joint section 2312. And then, means, such as screwing, fastening, or welding, is applied to join and fix the end of the second primary assembling piece 232 to the joint section 2312. Specifically, for example the second primary assembling piece 232 forms a protrusion at a corresponding location on a surface thereof, and the protrusion of the second primary assembling piece 232 is embedded in the recess the first primary assembling piece 231 at a corresponding location in order to join the first primary assembling piece 231 and the second primary assembling piece 232, as shown in FIG. 11. Further, the second primary assembling piece 232 may form, on one end thereof, at least two protrusions that are spaced in the lengthwise direction of the second primary assembling piece 232, such as two, three, or four protrusions.

Figure 23:
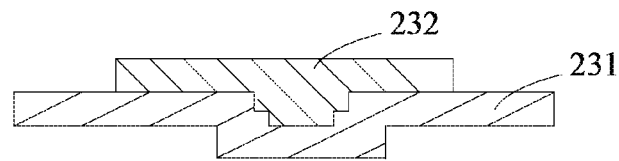
FIG. 23 is a schematic view showing a joining structure of a joint section of a back frame of a flat panel display device according to a tenth embodiment of the present invention.
Figure 24:
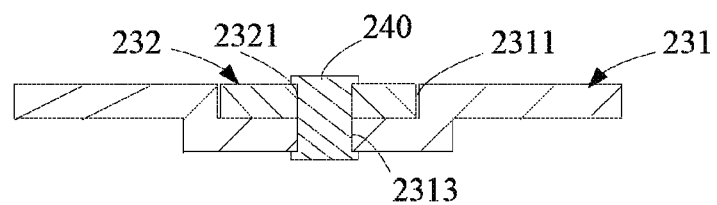
FIG. 24 is a schematic view showing a joining structure of a joint section of a back frame of a flat panel display device according to an eleventh embodiment of the present invention.

Furthermore, the recess of the first primary assembling piece 231 can be a recess of a multi-stepped configuration and the second primary assembling piece 232 forms, at a corresponding location, a protrusion having a multi-stepped configuration corresponding to the recess, as shown in FIG. 23. Further, as shown in FIG. 24, taking the joint section 2311 as an example, the recess of the first primary assembling piece 231 forms, in a bottom thereof, a first through hole 2313, and the second primary assembling piece 232 forms, at a location corresponding to the joint section 2311, a second through hole 2321. The back frame 23 further comprises a fastener 240. The fastener 240 extends through the first through hole 2313 and the second through hole 2321 to joint the first primary assembling piece 231 and the second primary assembling piece 232 to each other.

Figure 25:
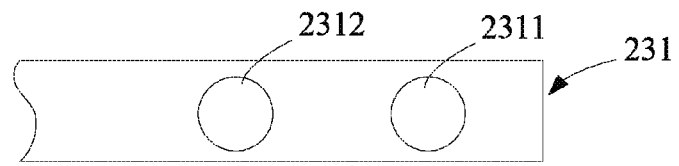
FIG. 25 is a schematic view showing a joint section of a back frame of a flat panel display device according to a twelfth embodiment of the present invention.

As shown in FIG. 25, in another embodiment of the back frame of flat panel display device according to the present invention, the recesses of the joint sections 2311, 2312 of the first primary assembling piece 231 are of a circular shape. Yet, in other embodiments, those skilled in the art may arrange the shape of the recesses to be other polygonal configurations, such as triangle.

Figure 26:
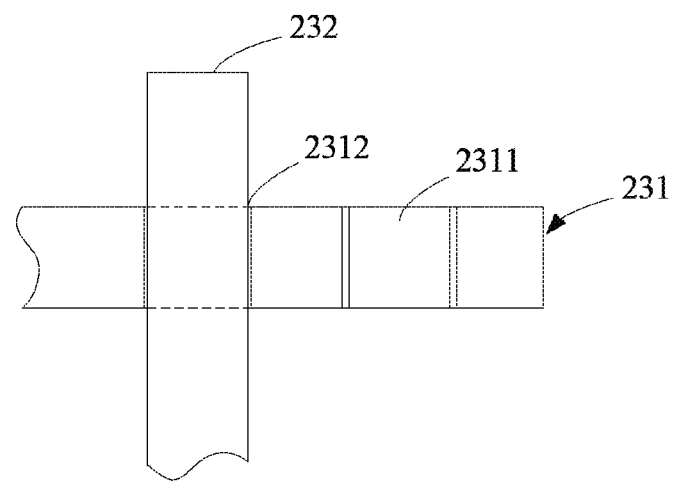
FIG. 26 is a schematic view showing a joint section of a back frame of a flat panel display device according to a thirteenth embodiment of the present invention.

As shown in FIG. 26, in another embodiment of the back frame of flat panel display device according to the present invention, the joint sections 2311, 2312 are recesses that do not extend through opposite surfaces of the first primary assembling piece 231, whereby an end of the second primary assembling piece 232 is movable within the joint sections 2311, 2312. For example, after the end of the second primary assembling piece 232 is set extending beyond and joined and fixed to the joint section 2312, the portion of extension is then trimmed off so that the length of the second primary assembling piece 232 that serves as a primary assembling piece of the back frame can be adjusted.

Figure 22:
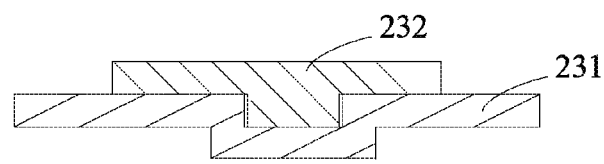
FIG. 22 is a schematic view showing a joining structure of a joint section of a back frame of a flat panel display device according to a ninth embodiment of the present invention.

In a practical application, the other end of the first primary assembling piece 231 and both ends of the third primary assembling piece 233 are all provided with two joint sections having a structure identical to that of the joint sections 2311, 2312. The ends of the second primary assembling piece 232 and the ends of the fourth primary assembling piece 234 may be subjected to specific designs or no design at all according to the application. For example:

(1) In a first situation, as shown in FIG. 21, the two ends of the second primary assembling piece 232 and the two ends of the fourth primary assembling piece 234 are of no specific design. In other words, the ends are of the same structure as the remaining portions. Under this condition, in making a join with a selected joint section 2311 (2312) at one end of the first primary assembling piece 231 (the same applicable to the other end), if an attempt is made to change the width of the back frame 23, then the length of the corresponding second primary assembling piece 232 and fourth primary assembling piece 234 must be selected accordingly. Namely, if the joint section 2311 that is close to the very end of the first primary assembling piece 231 is selected for joining, then no trimming is applied to the second primary assembling piece 232 and the fourth primary assembling piece 234 or the portion that is trimmed off is short; if the joint section 2312 that is distant from the very end of the first primary assembling piece 231 is selected for joining, then the second primary assembling piece 232 and the fourth primary assembling piece 234 are trimmed and the trimmed portion being long or short is according to the distance that the joint section is from the very end of the first primary assembling piece 231 being great or small; and (2) In a second situation, it is similar to the first situation, but as shown in FIG. 22, the second primary assembling piece 232 and the fourth primary assembling piece 234 use different protrusions to respectively mate the first primary assembling piece 231 and the third primary assembling piece 233 in order to realize change of width of the back frame 23; similarly, if a joint section 2312 other than the first joint section 2311 that is close to the very end of the first primary assembling piece 231 is selected for joining, then before or after joining, excessive portions of the second primary assembling piece 232 and the fourth primary assembling piece 234 may be trimmed off.

This also applicable to a main frame structure 27 of the back frame 23 that is formed by joining two L-shaped primary assembling pieces.

In summary, the present invention provides a back frame 23 having a first primary assembling piece that is provided with at least two joint sections. The number of the joint section can be selected according to the requirement of customers. In the instant embodiment, a description is given to an example comprising two joint sections 2311, 2312. Thus, to prepare the molds for making the back frame 23, only two sets of mold are needed, namely one mold for a first primary assembling piece and the other mold for a second primary assembling piece. The first primary assembling piece may be provided with a plurality of joint sections for joining operation in order to form various sizes for the back frame 23. To assemble the back frame 23, based on the desired size of the back frame 23, the corresponding one of the joint sections is selected. With the joint section, the second primary assembling piece is joined to the joint section of the first primary assembling piece and the other joint section of the first primary assembling piece that is located outward of the joining location of the second primary assembling piece is trimmed off to obtain a desired size of the back frame 23. Compared to the conventional technology that requires different back frame molds for making different sizes of back frame 10, the back frame of the flat panel display device 23 according to the present invention requires only a mold for the first primary assembling piece and a mold for the second primary assembling piece 28 so that mold sharing among various sizes of product can be realized and the molds used are of simple structures, allowing of reduction of expenditure of the molds for back frames.

Figure 27:
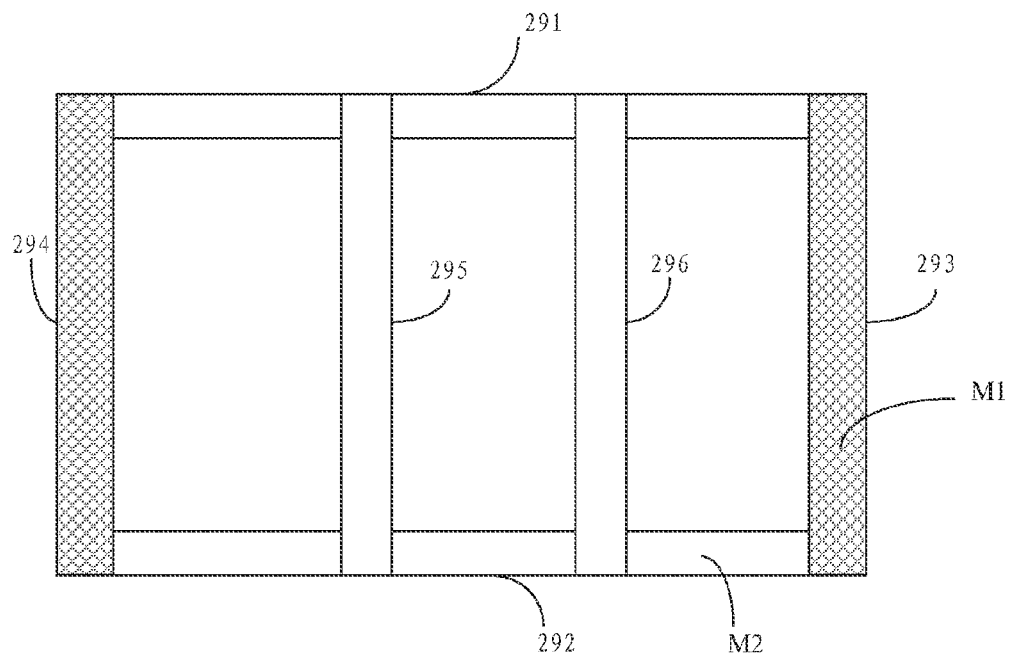
FIG. 27 is a schematic view showing a back frame of a flat panel display device according to a fourteenth embodiment of the present invention.
Figure 28:
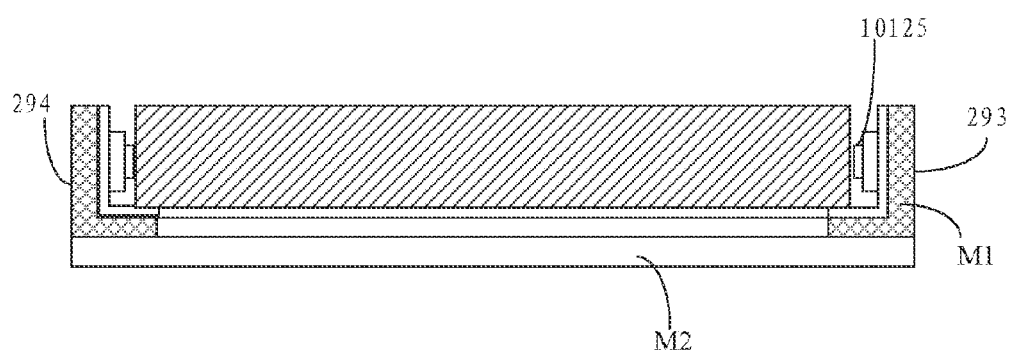
FIG. 28 is a schematic view showing a flat panel display device according to a fifteenth embodiment of the present invention.
Figure 31:
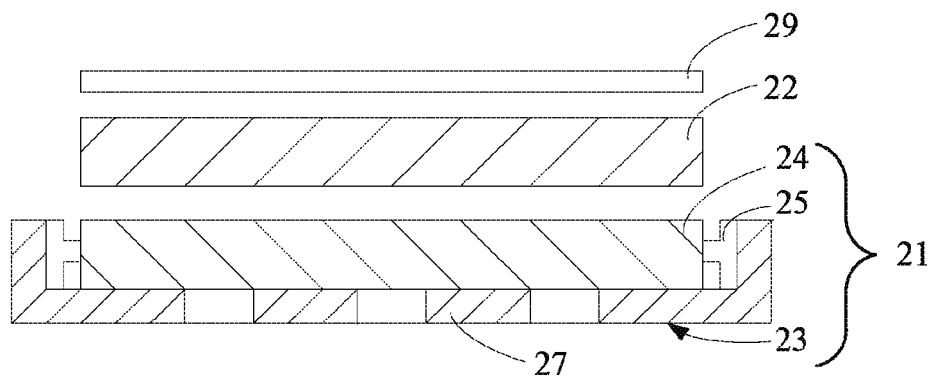
FIG. 31 is a schematic view showing a flat panel display device with a touch screen according to a seventeenth embodiment of the present invention.

Referring to FIGS. 27-28, an example of four primary assembling pieces and two secondary assembling pieces will be given to describe the difference in material section for the primary assembling piece of the back frame 23 of the flat panel display device 20 according to the present invention having a heat source arranged thereon and the assembling piece having no heat source arranged thereon.

In the four primary assembling pieces and the two secondary assembling pieces, at least two primary assembling pieces comprise the primary assembling piece that has a heat source arranged thereon. The primary assembling piece that has the heat source arranged thereon has a first heat transfer capability. The remaining one or more primary assembling pieces of the at least two primary assembling pieces that have no heat source arranged thereon have a second heat transfer capability. The first heat transfer capability is greater than the second heat transfer capability.

The heat source can be a light-emitting diode (LED), a printed circuit board (PCB), or other electronic devices that generate heat. LED is taken an example here. A parameter that represents the heat transfer capability can be thermal conductivity. In other words, the primary assembling piece that has a heat source arranged thereon has a thermal conductivity that is greater than the thermal conductivity of the remaining one or more primary assembling pieces that have no heat source arranged thereon.

The primary assembling piece that has a heat source arranged thereon has a first strength. The remaining one or more primary assembling pieces of the at least two primary assembling pieces that have no heat source arranged thereon have a second strength. The second strength is greater than the first strength.

The primary assembling piece that has the first heat transfer capability and the first strength is an aluminum piece and the primary assembling pieces that have the second heat transfer capability and the second strength are galvanized steel pieces. Certainly, besides aluminum pieces, other pieces having a better capacity of heat dissipation can be copper pieces, magnesium alloys, or open aluminum alloy foams. Besides galvanized steel pieces, pieces having a better strength can be organic pieces or tinned iron piece.

An example of back frame that comprises four primary assembling pieces and two secondary assembling pieces will be given as follow. As shown in FIGS. 27-28, a first primary assembling piece 291, a second primary assembling piece 292, a third primary assembling piece 293, a fourth primary assembling piece 294, a first secondary assembling piece 295, and a second secondary assembling piece 296 constitute a back frame. The primary assembling pieces that have a heat source 25 arranged thereon are the third primary assembling piece 293 and the fourth primary assembling piece 294. The third primary assembling piece 293 and the fourth primary assembling piece 294 are made of aluminum pieces M1. The first primary assembling piece 291, the second primary assembling piece 292, the first secondary assembling piece 295, and the second secondary assembling piece 296 that do no have a heat source 10125 arranged thereon are made of galvanized steel pieces M2.

Further, the primary assembling piece that has a heat source arranged thereon can be a stacked structure of a first layer and a second layer, of which the first layer is adjacent to the heat source and the first layer has a heat transfer capability that is greater than heat transfer capability of the second layer.

The first layer is adjacent to the heat source and the material of the first layer can be selected to have a heat transfer capability greater than the heat transfer capability of the material of the second layer. For example, the first layer is an aluminum piece, or a copper piece, or magnesium alloys, or open aluminum alloy foams, and the second layer is an organic piece or tinned iron. Certainly, the primary assembling piece that carries the heat source 10125 can be of a single layer having a material used to make the first layer mentioned above.

Aluminum pieces and copper pieces have better performance of heat dissipation and are advantageous in extending lifespan of product. Galvanized steel has worse performance of heat dissipation, but the price is relatively low and strength is better. In the cost of a back frame, the material cost takes the greatest percentage. If the whole back frame is made of a material that has a better performance of heat dissipation, such as aluminum, then the cost is extremely high and the structural strength is poor. If it is completely made of a material having poor performance of heat dissipation, such as galvanized steel, then the heat dissipation will be poor and the product performance will be deteriorated. Thus, in practical applications, different materials must be used in manufacturing for different positions, such as a combination of aluminum piece and galvanized steel pieces, in order to minimize the product cost and at the same time ensure the requirements of heat dissipation and strength are satisfied, so that the material cost can be reduced and the product cost is lowered. Certainly, the above embodiments of different material selection for the primary assembling pieces are also applicable to a main frame structure that is formed by joining two L-shaped primary assembling pieces.

The present invention also provides a mold for making a back frame of flat panel display device. The back frame mold is provided with a main pattern for forming a primary assembling piece of the back frame and the main pattern comprises a sub-pattern that forms at least two joint sections on an end of the primary assembling piece. The primary assembling piece comprises the previously discussed first primary assembling piece and second primary assembling piece, corresponding to the above mentioned main pattern; and the joint section comprises the previously discussed joint section of the first primary assembling piece, corresponding to the above mentioned sub-pattern. Repeated description is omitted herein.

Referring to FIG. 29, a schematic view showing a back frame of flat panel display device according to the present invention is shown, a first primary assembling piece 261 and a second primary assembling piece 262. The first primary assembling piece 261 has an end joined to an end of the second primary assembling piece 262, and the first primary assembling piece 261 has another end joined to another end of the second primary assembling piece 262 in order to form the main frame structure 27 of the back frame 23. The first primary assembling piece 261 and the second primary assembling piece 262 are both aluminum pieces or galvanized steel pieces. In the instant embodiment, the first primary assembling piece 261 and the second primary assembling piece 262 are L-shaped.

Referring to FIG. 3, the first primary assembling piece 261 comprises a joint section 2611 and the second primary assembling piece 262 comprises a joint section 2612. At least one of the first primary assembling piece 261 and the second primary assembling piece 262 comprises a reinforcement structure (not shown) on the joint section thereof. In other words, the reinforcement structure is arranged on at least the joint section 2611 or the joint section 2612.

Referring to FIG. 34, a bracing piece 60 is formed by joining bracing members 601, 602. Two ends of the bracing piece 60 are respectively fixed to assembling pieces 61, 62. The assembling pieces 61, 62 are mountable to the bracing piece 60 in at least two different positions in the lengthwise direction of the bracing piece 60, wherein the assembling pieces 61, 62 can be the primary assembling pieces or the secondary assembling pieces of each of the above embodiments. In other words, the bracing piece 60 can be mounted to the primary assembling pieces or the secondary assembling pieces, or can be mounted to both the primary assembling pieces and the secondary assembling pieces, wherein available mounting points between the bracing piece 60 and the primary assembling pieces or the secondary assembling pieces are of a number of at least two (corresponding to the previously mentioned two different positions), so that the bracing piece 60 can be mounted to different positions in the back frame. In other backup embodiments, the bracing piece 60 may has only one end fixed to the assembling piece, while the other end is arranged in a suspending form. The bracing piece 60 may also be of a unitary design.

Figure 42:
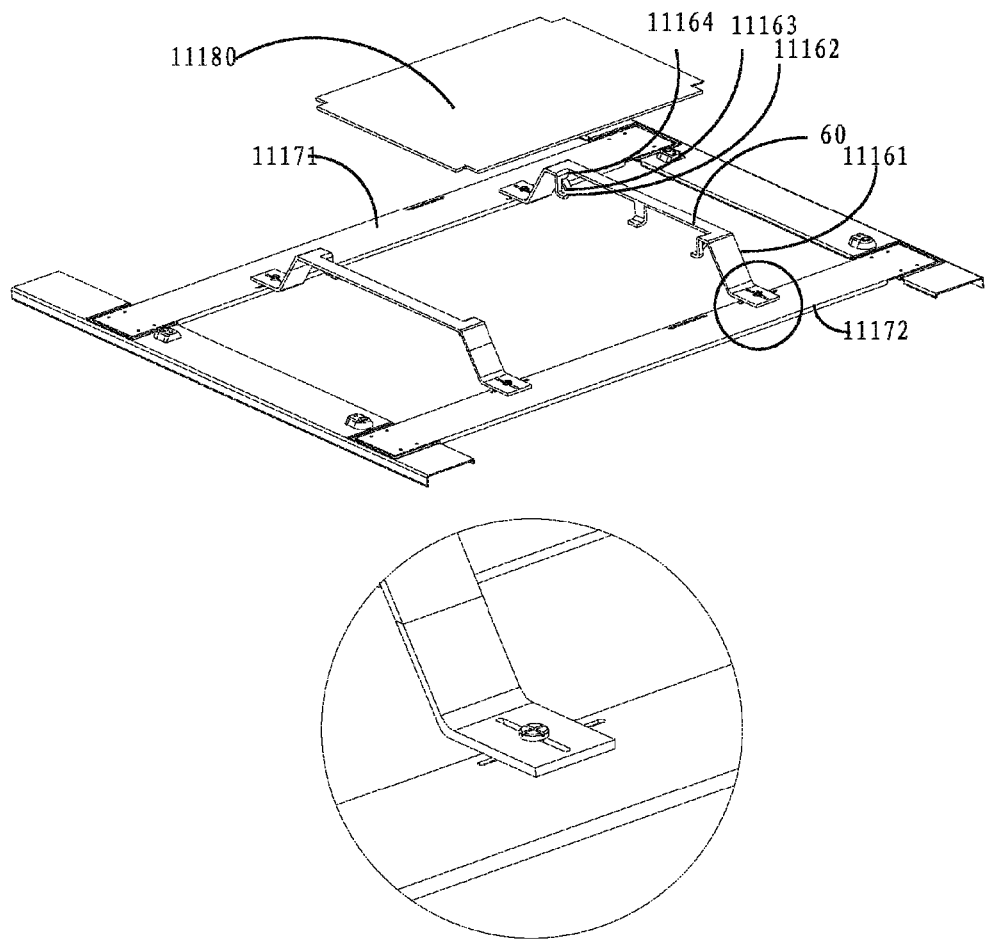
FIG. 42 is a schematic view showing a portion of a back frame of a flat panel display device according to a twenty-second embodiment of the present invention.

Referring to FIG. 42, the bracing piece 60 comprises a bracing body 11161, a first suspension section 11162, a first bearing section 11163, and a first resilient bent section 11164. In other words, the bracing body 11161 is mounted to the primary assembling pieces or the secondary assembling pieces, or is mounted to both the primary assembling pieces and the secondary assembling pieces, wherein available mounting points between the bracing body 11161 and the primary assembling pieces or the secondary assembling pieces are of a number of at least two so that the bracing body can be mounted to different positions in the back frame. In the instant embodiment, the bracing body 11161 is of a step-like configuration and bridges between two assembling pieces 11171, 11172.

The present invention also provides a mold for making a back frame of flat panel display device. The back frame mold is provided with a main pattern for forming a primary assembling piece of the back frame and the main pattern comprises a sub-pattern that forms at least two joint sections on an end of the primary assembling piece. The primary assembling piece comprises the previously discussed first primary assembling piece and second primary assembling piece, corresponding to the above mentioned main pattern; and the joint section comprises the previously discussed joint section of the first primary assembling piece, corresponding to the above mentioned sub-pattern. Repeated description is omitted herein.

Referring to FIG. 30, the present invention also provides a method for making a back frame of flat panel display device. The method comprises the following steps:

Step 501: manufacturing at least two primary assembling pieces, the at least two primary assembling pieces comprising a primary assembling piece that carries a heat source. The primary assembling piece that carries the heat source has a first heat transfer capability, and the remaining one or more primary assembling pieces of the at least two primary assembling pieces that carry no heat source have a second heat transfer capability, the first heat transfer capability being greater than the second heat transfer capability; and Step 502: joining the at least two primary assembling pieces.

In the instant embodiment, when other joint sections are present between the joining location of the second primary assembling piece and the end of the first primary assembling piece, before or after the step of selecting one joint section of the at least two joint sections according to a size of the back frame to join the corresponding end of the second primary assembling piece, the other joint sections of the first primary assembling piece that are located outward of the joining position of the second primary assembling piece are trimmed off. The first primary assembling piece comprises the previously discussed first primary assembling piece, and the second primary assembling piece comprises the previously discussed second primary assembling piece, and repeated description will be omitted herein.

As shown in FIG. 22, the flat panel display device 20 of the present invention further comprises a touch screen 29. The touch screen 29 is arranged on a light exit surface of the display panel 22 of the flat panel display device 20. The flat panel display device 20 comprises: the backlight system 21 and the above discussed display panel 22. The backlight system 21 is arranged at the back side of the display panel 22 and supplies light to the display panel 22.

The backlight system 21 comprises a light source 25, a light homogenization mechanism 24, and a back frame 23. The back frame 23 carries the light source 25 and the light homogenization mechanism 24. When the backlight system 21 is an edge lighting type, the light homogenization mechanism 24 is a light guide; and when the backlight system 21 is a direct type, the light homogenization mechanism 24 is a diffuser plate. The back frame 23 comprises at least a first primary assembling piece and a second primary assembling piece, and the at least one first and second primary assembling pieces constitute a main frame structure 27 of the back frame 23.

It is apparent that the backlight system 21 can be of a structure of any one of the previously discussed embodiments of the backlight system.

It is noted that the flat panel display device 20 of the present invention can be a liquid crystal display device or a liquid crystal television.

Figure 32:
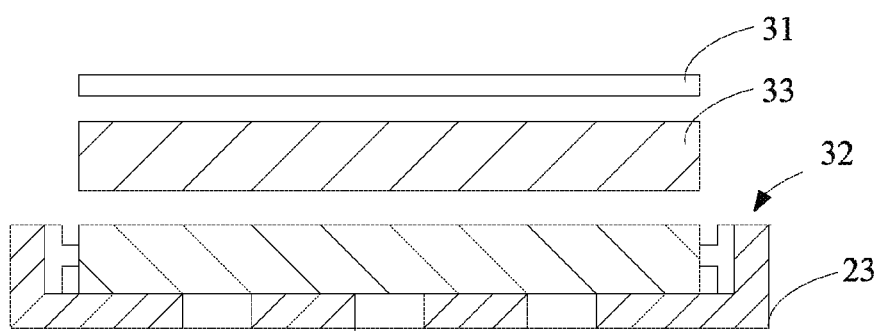
FIG. 32 is a schematic view showing a stereoscopic display device according to an eighteenth embodiment of the present invention.

The present invention also provides a stereoscopic display device 30. As shown in FIG. 32, the stereoscopic display device 30 comprises a liquid crystal lens grating 31, a backlight system 32, and a display panel 33. The liquid crystal lens grating 31 is arranged on a light exit surface of the display panel 33. The backlight system 32 can be a backlight system of any one of the above discussed embodiments, such as the backlight system 32 comprising a light source (not shown), a light homogenization mechanism (not shown), and the back frame 23. The back frame 23 carries the light source and the light homogenization mechanism. The light homogenization mechanism guides light from the light source to a light incidence surface of the display panel 33. The back frame 23 comprises at least first primary assembling piece and the second primary assembling piece. The at least first and second primary assembling pieces form a main frame structure of the back frame. The backlight system 32 can be of a structure of any of the previously discussed embodiments of backlight system and repeated description will be omitted herein.

Figure 33:
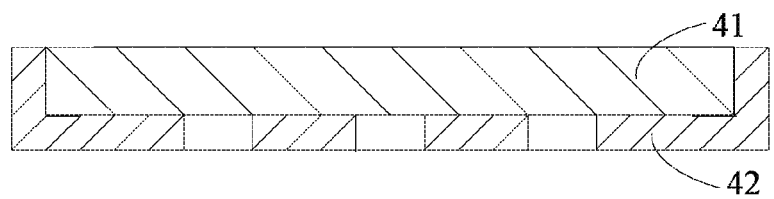
FIG. 33 is a schematic view showing a plasma display device according to a nineteenth embodiment of the present invention.

The present invention also provides a plasma display device 40. As shown in FIG. 33, the plasma display device 40 comprises a plasma display panel 41 and a back frame 42. The back frame 42 is arranged at a back side of the display panel 41. The back frame 42 can be the back frame of any one of the previously discussed embodiments and repeated description will be omitted herein.

The present invention also provides a bracing piece that is applicable to the back frame of each of the above disclosed embodiments, wherein the bracing piece is fixed to the assembling pieces and the assembling pieces are mountable to at least two different positions of the bracing piece in a lengthwise direction of the bracing piece, whereby the bracing piece is movable to make positions of bumps that are provided on the bracing piece for positioning purposes adjustable in order to meet the needs for different assembling requirements of the back frame.

Specifically, as shown in FIG. 34, in the instant embodiment, the bracing piece 60 is formed by joining bracing members 601, 602. Two ends of the bracing piece 60 are respectively fixed to assembling pieces 61, 62. The assembling pieces 61, 62 are mountable to the bracing piece 60 in at least two different positions in the lengthwise direction of the bracing piece 60, wherein the assembling pieces 61, 62 can be the primary assembling pieces or the secondary assembling pieces of each of the above embodiments. In other backup embodiments, the bracing piece 60 may has only one end fixed to the assembling piece, while the other end is arranged in a suspending form. The bracing piece 60 may also be of a unitary design.

Further, referring in combination to FIGS. 35-36, formed in an end of the bracing member 601 that is fixed to the assembling piece 61 is an elongate through hole 6011 that is arranged in the bracing member 601 in the lengthwise direction of the bracing piece 60. The bracing member 601 is fixed by a screw 63 to the assembling piece 61 of the back frame. The screw 63 is positionable in different locations within the elongate through hole 6011. Thus, in assembling, the elongate through hole 6011 is put to overlap a threaded hole 611 of the assembling piece 61 and according to the need for mounting, the position of the bracing member 601 on the assembling piece 61 is adjusted in the lengthwise direction of the bracing piece 60 so as to adjust the position of the bump 6012 of the bracing member 601 with respect to the assembling piece 61. After the bump 6012 of the bracing member 601 has been adjusted to a desired position, the screw 63 is set in a corresponding position within the elongate through hole 6011 and engages the threaded hole 611 of the assembling pieces 61 to thereby fix the bracing member 601 to the assembling piece 61.

Figure 37:
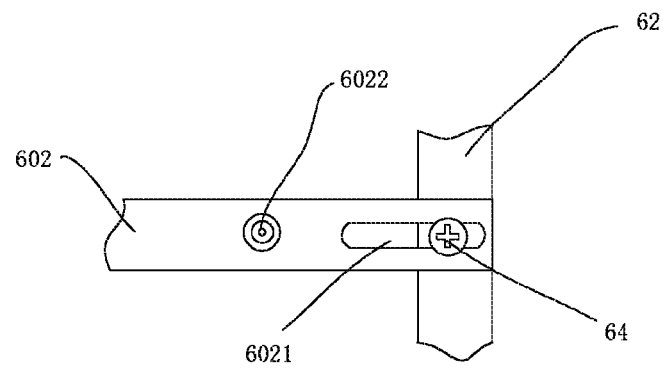
FIG. 37 is an enlarged view showing a mounting site of another bracing member of the back frame and another assembling piece shown in FIG. 34.
Figure 38:
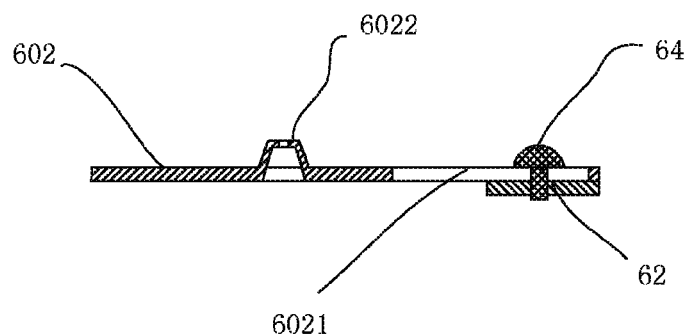
FIG. 38 is a cross-sectional view showing the mounting site of said another bracing member of the back frame and said another assembling piece shown in FIG. 34.

Similarly, referring in combination to FIGS. 37-38, in an end of the bracing member 602 that is fixed to the assembling piece 62, an elongate through hole 6021 is formed in the lengthwise direction of the bracing piece 60. A screw 64 is positionable in different positions within the elongate through hole 6021, whereby by having the screw 64 engaging a threaded hole 621 of the assembling piece 62, the bracing member 602 is fixed to the assembling piece 62, so as to realize position adjustment of a bump 6022 with respect to the assembling piece 62.

Figure 39:
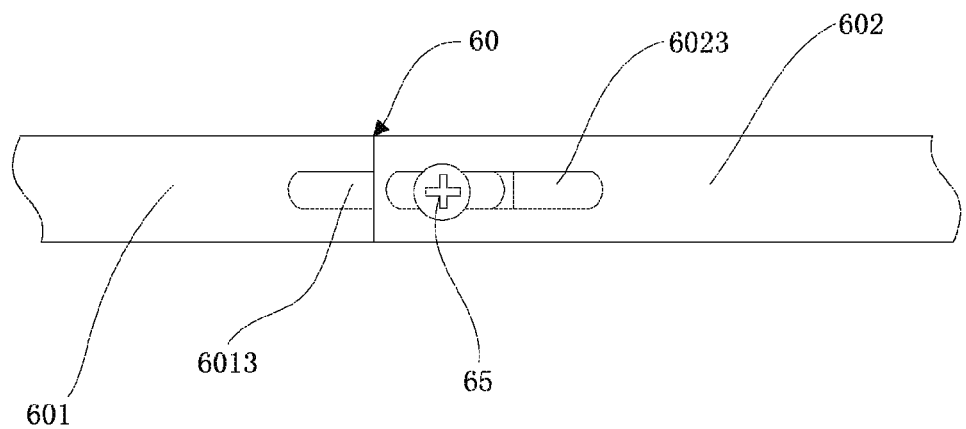
FIG. 39 is an enlarged view showing a mounting site of two bracing members of a back frame shown in FIG. 34.
Figure 40:
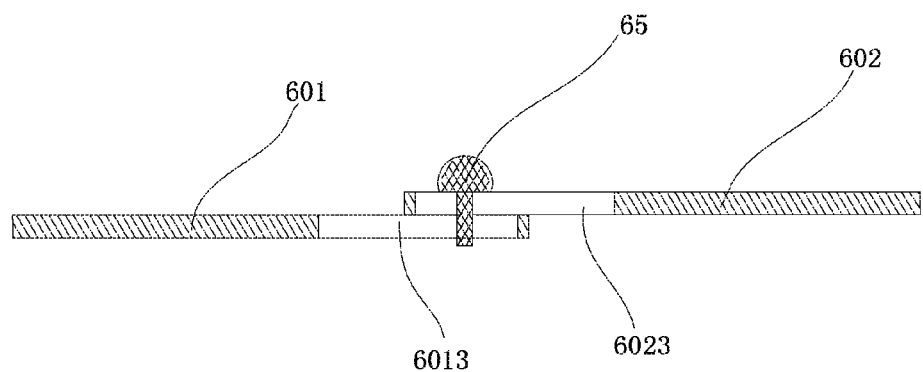
FIG. 40 is a cross-sectional vie showing the mounting site of the two bracing members of the back frame shown in FIG. 34.

Further referring in combination to FIGS. 39-40, in ends of the bracing member 601 and the bracing member 602 that are fixed to each other, an elongate through hole 6013 is formed in the bracing member 601 in the lengthwise direction of the bracing piece 60, and an the elongate through hole 6023 is formed in the bracing member 602 in the lengthwise direction of the bracing piece 60. The bracing member 601 is fixed by a screw 65 to the bracing member 602. The screw 65 can be set at any position within the elongate through holes 6013, 6023. In assembling, the elongate through holes 6013, 6023 are set to overlap each other and the positions of the bracing members 601 and 602 in the lengthwise direction of the bracing piece 60 are adjusted according to the needs for mounting so as to adjust the positions of bumps 6012, 6022 with respect to the assembling pieces 61, 62 (see FIG. 42) and the length of the bracing piece 60. After the adjustment of position, the screw 65 is set to a corresponding position between the elongate through holes 6013 and 6023 and screwing is carried out to fix the bracing member 601 to the bracing member 602. In other backup embodiments, the screws 63, 64, 65 can be replaced by other fasteners, such as rivets and bolts.

Figure 41:
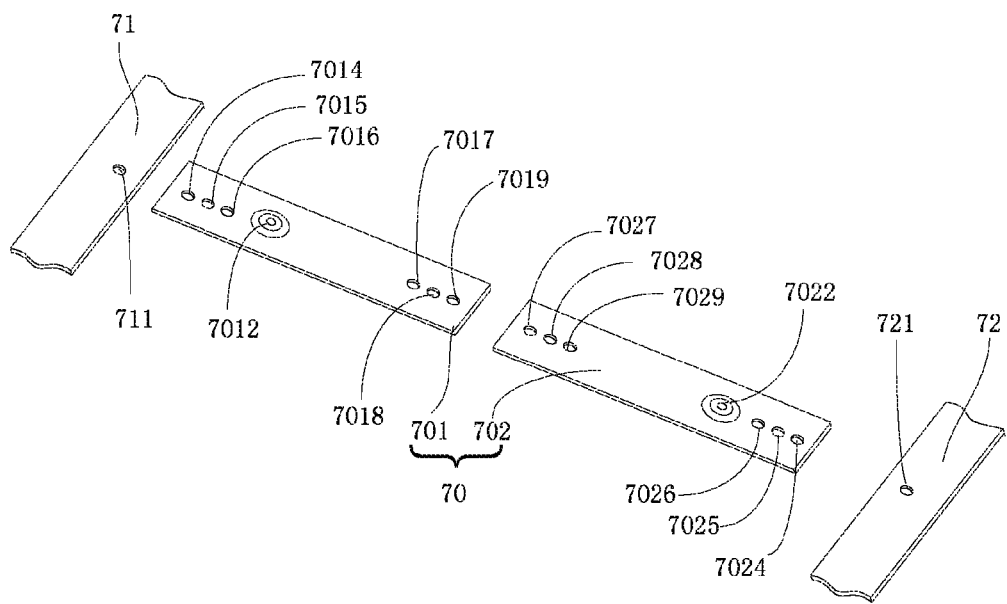
FIG. 41 is a schematic view showing a portion of a back frame of a flat panel display device according to a twenty-first embodiment of the present invention.

As shown in FIG. 41, in the instant embodiment, the bracing piece forms at least two through holes that are spaced in the lengthwise direction of the bracing piece to replace the elongate through hole of the above embodiments. Specifically, in the end of the bracing member 701 that is fixed to the assembling piece 71, a plurality of through holes 7014, 7015, 7016 is arranged in the lengthwise direction of the bracing piece 70. A screw (not shown) can be set in one of the through holes 7014, 7015, 7016 and engages a threaded hole 711 defined in the assembling piece 71 so as to fix the bracing member 701 to the assembling piece 71, thereby realizing position adjustment of a bump 7012 with respect to the assembling piece 71.

Similarly, in an end of the bracing member 702 that is fixed to the assembling piece 72, a plurality of through holes 7024, 7025, 7026 is arranged in the lengthwise direction of the bracing piece 70. A screw (not shown) can be set in one of the through holes 7024, 7025, 7026 and engages a threaded hole 721 defined in the assembling piece 72 so as to fix the bracing member 702 to the assembling piece 72, thereby realizing position adjustment of a bump 7022 with respect to the assembling piece 72.

Further, in ends of the bracing member 701 and the bracing member 702 that are fixed to each other, a plurality of through holes 7017, 7018, 7019 is arranged in the bracing member 701 in the lengthwise direction of the bracing piece 70 and a plurality of through holes 7027, 7028, 7029 is arranged in the bracing member 702 in the lengthwise direction of the bracing piece 70. A screw (not shown) can be set in any of the plurality of through holes 7017, 7018, 7019 and any one of the plurality of through holes 7027, 7028, 7029. In assembling, the positions of the bracing members 701 and 702 in the lengthwise direction of the bracing piece are adjusted according to the needs for mounting and corresponding ones of the through holes are set to overlap each other so as to adjust the positions of bumps 7012, 7022 with respect to the assembling pieces 71, 72 and the length of the bracing piece 70. After the position adjustment, a screw is set to the overlapped position of corresponding through holes to carry out screwing so as to fix the bracing member 701 to the bracing member 702.

In the above embodiments, the bracing piece is fixed by screws to the assembling pieces, but those having ordinary skills in the art may easily contemplate that fasteners, such as rivets, can be used for fixing. The present invention imposes no specific limitation in this respect.

Figure 43:
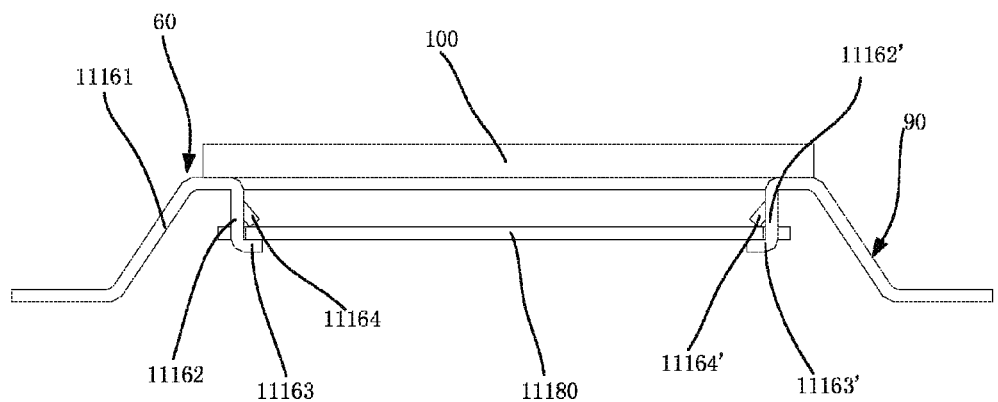
FIG. 43 is a cross-sectional view showing a bracing piece of the back frame of FIG. 42 and a circuit board.

The present invention also provides a bracing piece that is applicable to each of the above described embodiments and that is mounted to assembling pieces to fix a circuit board. Referring to FIGS. 42-43, assembling pieces 11171, 11172 are the various assembling pieces described in the above discussed embodiments, including the primary assembling pieces that are joined to form a main frame structure of a back frame or the secondary assembling pieces that are arranged inside the main frame structure and joined to the main frame structure. A bracing piece 60 comprises a bracing body 11161, a first suspension section 11162, a first bearing section 11163, and a first resilient bent section 11164. The bracing body 11161 is fixed to the assembling pieces 11171 and 11172. In the instant embodiment, the bracing body 11161 is of a step-like configuration and bridges between the two assembling pieces 11171, 11172. However, in backup embodiments of the present invention, the bracing body 11161 can be of a straight bar like configuration or other shapes. Further, the bracing body 11161 can be fixed to the assembling piece with only one end thereof, while the other end is arranged in a suspending form to simplify mounting process.

The first suspension section 11162 extends from the bracing body 11161 in a lengthwise direction of the bracing body 11161. The first bearing section 11163 is spaced from the bracing body 11161 and extends from the first suspension section 11162 in a lengthwise direction of the first suspension section 11162. The first resilient bent section 11164 is located between the first bearing section 11162 and the bracing body 11161 and is bent from the first suspension section 11163 in a lengthwise direction of the first suspension section 11162. The first bearing section 11163 and the first resilient bent section 11164 resiliently clamp a first side edge of a circuit board 80.

Referring to FIG. 43, the bracing piece 11160 further comprises a second suspension section 11162', a second bearing section 11163', and a second resilient bent section 11164'. The second suspension section 11162' is spaced from the first suspension section 11162 and extends from the bracing body 11161 in a sideway direction of the bracing body 11161. The second bearing section 11163' is spaced from the bracing body 11161 and extends from the second suspension section 11162' in a lengthwise direction of the second suspension section 11162'. The second resilient bent section 11164' is located between the second bearing section 11163' and the bracing body 11161 and the bracing body 11161 and is bent from the second suspension section 11162' in a lengthwise direction of the second suspension section 11162'. The second bearing section 11163' and the second resilient bent section 11164' resiliently clamp a second side edge of the circuit board 80 that is opposite to the first side edge. In a preferred embodiment, the first suspension section 11162, the first bearing section 11163, and the first resilient bent section 11164 and the second suspension section 11162', the second bearing section 11163', and the second resilient bent section 11164' are symmetric with respect to a center line of the bracing body 11161. In a backup embodiment of the present invention, the bracing body 11161 of the bracing piece 11160 may comprise only the first suspension section 11162, the first bearing section 11163, and the first resilient bent section 11164 for only resiliently clamping the first side edge of the circuit board 11180, and an additional bracing piece that is identical to the bracing piece 11160 is provided to resiliently clamp the second side edge of the circuit board 11180.

Referring to FIG. 43, after the circuit board 11180 is mounted, an electromagnetic shielding piece 100 is set on the bracing body 11161. The electromagnetic shielding piece 100 is spaced from the circuit board 11180 to shield electromagnetic signals generated by the circuit board 11180. The electromagnetic shielding piece 100 can be a Faraday cage or a metal plate.

Referring to FIG. 42, in the instant embodiment, a bracing piece 90 that is identical in structure to the bracing piece 60 is further provided. The bracing piece 90 is spaced from the bracing piece 60 to clamp different locations of the first and second side edges of the circuit board 11180.

With the above discussed manners, the present invention provides a back frame and a backlight system, which form a back frame through joining operations so that a back frame has a simple structure, the material used for the back frame is saved, and the manufacturing cost of a backlighting display device is reduced. Further, with a bracing piece that comprises a bracing body, a first suspension section, a first bearing section, and a first resilient bent section arranged to fix a circuit board, the expenditure of back frame mold is reduced and the problem that a circuit board cannot be easily fixed is overcome.

With the above discussed manners, the present invention provides a flat panel display device, a stereoscopic display device, and a plasma display device that have a mold for back frame that is of a simple structure, reduce material cost and mold cost, facilitate heat dissipation, facilitate retention of back frame, is easy to use, and facilitate fixing a circuit board.

Embodiments of the present invention have been described, but are not intending to impose any undue constraint to the appended claims of the present invention. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A flat panel display device, wherein the flat panel display device comprises a backlight system and a display panel, wherein:
   the backlight system comprises a light source, a light homogenization mechanism, and a back frame;
   the back frame carries the light source and the light homogenization mechanism, the light homogenization mechanism guiding light from the light source into the display panel; the back frame comprises primary assembling pieces, secondary assembling pieces, and a bracing piece for fixing a circuit board having at least one major surface having a normal direction;
   the primary assembling pieces have a number of at least two, at least one of the primary assembling pieces having an end forming a joint section, the at least two primary assembling pieces being joined through the corresponding joint sections, the secondary assembling pieces being connected to the primary assembling pieces through joining;
   at least one of the primary assembling pieces comprises a reinforcement structure formed on the joint section thereof;
   the at least two primary assembling pieces comprise a primary assembling piece that has a heat source arranged thereon, the primary assembling piece that has the heat source arranged thereon having a first heat transfer capability, the remaining one or more primary assembling pieces of the at least two primary assembling pieces that have no heat source arranged thereon having a second heat transfer capability, the first heat transfer capability being greater than the second heat transfer capability;
   the bracing piece comprises a bracing body, a first suspension section and a second suspension section, a first bearing section and a second bearing section, and a first resilient bent section and a second resilient bent section, the bracing body being fixed to the primary assembling pieces or the secondary assembling pieces or both of the primary assembling pieces and the secondary assembling pieces; and
   the first suspension section and the second suspension section extend from the bracing body to be spaced from and opposing each other so as to define therebetween a receiving space for receiving the circuit board therein in such a way that the first and second suspension sections respectively engage first and second opposite side edges of the circuit board by having the circuit board moved into the space in a predetermined direction substantially parallel to the normal direction of the circuit board, the first bearing section and second bearing section being spaced from the bracing body and respectively extending from the first suspension section and the second suspension section to collectively receive the circuit board to be positioned thereon, the first resilient bent section and the second resilient bent section being respectively located between the first and second bearing sections and the bracing body and being respectively bent from the first and second suspension sections toward each other to define a passage having a size smaller than the receiving space, whereby when the circuit board is moved in the predetermined direction substantially parallel to the normal direction of the circuit board to reach and be positioned on the first and second bearing sections, the first bearing section and the first resilient bent section resiliently clamp the first side edge of the circuit board and the second bearing section and the second resilient bent section resiliently clamp the second side edge of the circuit board so as to clamp the circuit board between the first and second suspension sections of the bracing piece.

2. The flat panel display device as claimed in claim 1, wherein:
   the at least two primary assembling pieces comprises a first primary assembling piece and a second primary assembling piece.

3. The flat panel display device as claimed in claim 2, wherein:
   the joint sections comprise recesses formed in a surface of the first primary assembling piece and having a shape corresponding to the end of the second primary assembling piece for receiving the end of the second primary assembling piece.

4. The flat panel display device as claimed in claim 3, wherein the recess of the first primary assembling piece forms a first through hole in a bottom thereof, a second through hole being formed in the second primary assembling piece at a corresponding position, the back frame comprising a fastener, the fastener extending through the first through hole and the second through hole to joint the first primary assembling piece and the second primary assembling piece.

5. The flat panel display device as claimed in claim 2, wherein:
   the joint sections comprise recesses formed in the surface of the first primary assembling piece, the second primary assembling piece having an end having a surface forming protrusions at corresponding positions, the protrusions being receivable in the recesses to join the first primary assembling piece and the second primary assembling piece to each other.

6. The flat panel display device as claimed in claim 2, wherein:
   the back frame comprises a third primary assembling piece and a fourth primary assembling piece; and
   the first primary assembling piece, the second primary assembling piece, the third primary assembling piece, and the fourth primary assembling piece are straight linear and are joined in a leading end-to-tailing end manner to form a rectangular main frame structure enclosing the back frame.

7. The flat panel display device as claimed in claim 6, wherein:
   the secondary assembling pieces comprise a first secondary assembling piece and a second secondary assembling piece, the first secondary assembling piece having two ends respectively joined to at least two primary assembling pieces of the first primary assembling piece, the second primary assembling piece, the third primary assembling piece, and the fourth primary assembling piece, the second secondary assembling piece having two ends respectively joined to at least two primary assembling pieces of the first primary assembling piece, the second primary assembling piece, the third primary assembling piece, and the fourth primary assembling piece.

8. The flat panel display device as claimed in claim 6, wherein:
the two ends of the first secondary assembling piece are respectively joined to the first primary assembling piece and the second primary assembling piece that are adjacent to each other and the two ends of the second secondary assembling piece are respectively joined to the third primary assembling piece and the fourth primary assembling piece that are adjacent to each other; or the two ends of the first secondary assembling piece are respectively joined to the first primary assembling piece and the third primary assembling piece that are opposite to each other and the two ends of the second secondary assembling piece are respectively joined to the first primary assembling piece and the third primary assembling piece that are opposite to each other, the second primary assembling piece, the fourth primary assembling piece, the first secondary assembling piece, and the second secondary assembling piece being arranged parallel to each other.

9. The flat panel display device as claimed in claim 8, wherein:
the back frame comprises at least one bracing piece, which is releasably fixed to one or more of the first primary assembling piece, the second primary assembling piece, the third primary assembling piece, the fourth primary assembling piece, the first secondary assembling piece, and the second secondary assembling piece, the bracing piece forming a bump.

10. The flat panel display device as claimed in claim 1, wherein:
each of the primary assembling pieces has a cross-section of the joint section that has a line-folded configuration in order to form the reinforcement structure, the line-folded configuration comprising at least two joined line segments, the reinforcement structures of the two primary assembling pieces being stacked in a recess-projection paired form.

11. The flat panel display device as claimed in claim 1, wherein:
each of the primary assembling pieces has a cross-section of the joint section that is an arc shape to form the reinforcement structure, the reinforcement structures of the two primary assembling pieces being stacked in a recess-projection paired form.

12. The flat panel display device as claimed in claim 1, wherein:
the primary assembling piece that has the heat source arranged thereon has a first strength, the remaining one or more primary assembling pieces of the at least two primary assembling pieces that have no heat source arranged thereon having a second strength, the second strength being greater than the first strength.

13. The flat panel display device as claimed in claim 12, wherein:
the primary assembling piece that has the first heat transfer capability and the first strength is an aluminum piece and the primary assembling pieces that have the second heat transfer capability and the second strength are galvanized steel pieces.

14. The flat panel display device as claimed in claim 1, wherein the bracing body forms at least two through holes that are spaced in the lengthwise direction of the bracing body, the secondary assembling piece being mountable to any one of the at least two through holes and the bracing body being fixed to the secondary assembling piece.

15. The flat panel display device as claimed in claim 1, wherein the bracing piece comprises at least two bracing members, wherein at least one of the bracing members is mountable to the primary assembling piece in a lengthwise direction of the primary assembling piece and the other one of the bracing members forms at least two through holes that are spaced in the lengthwise direction of the bracing piece, the primary assembling piece being mountable to any one of the at least two through holes.

16. The flat panel display device as claimed in claim 1, wherein the bracing body is of a step-like configuration and bridges between two of the primary assembling pieces, or two of the secondary assembling pieces, or between the primary assembling piece and the secondary assembling piece.

17. The flat panel display device as claimed in claim 1, wherein: the flat panel display device comprises a touch screen, the touch screen being positioned on a light exit surface of the display panel.

18. A stereoscopic display device, wherein:
the stereoscopic display device comprises a liquid crystal lens grating, a backlight system, and a display panel, the liquid crystal lens grating being arranged on a light exit surface of the display panel;
the backlight system comprises a light source, a light homogenization mechanism, and a back frame;
the back frame carries the light source and the light homogenization mechanism, the light homogenization mechanism guiding light from the light source to a light incidence surface of the display panel, the back frame comprises primary assembling pieces, secondary assembling pieces, and a bracing piece for fixing a circuit board having at least one major surface defining a normal direction;
the primary assembling pieces have a number of at least two, at least one of the primary assembling pieces having an end forming a joint section, the at least two primary assembling pieces being joined through the corresponding joint sections, the secondary assembling pieces being connected to the primary assembling pieces through joining;
at least one of the primary assembling pieces comprises a reinforcement structure formed on the joint section thereof;
the at least two primary assembling pieces comprise a primary assembling piece that has a heat source arranged thereon, the primary assembling piece that has the heat source arranged thereon having a first heat transfer capability, the remaining one or more primary assembling pieces of the at least two primary assembling pieces that have no heat source arranged thereon having a second heat transfer capability, the first heat transfer capability being greater than the second heat transfer capability;
the bracing piece comprises a bracing body, a first suspension section and a second suspension section, a first bearing section and a second bearing section, and a first resilient bent section and a second resilient bent section, the bracing body being fixed to the primary assembling pieces or the secondary assembling pieces or both of the primary assembling pieces and the secondary assembling pieces; and the first suspension section and second suspension section extend from the bracing body to be spaced from and opposing each other so as to define therebetween a receiving space for receiving the circuit board therein in such a way that the first and second suspension sections respectively engage first and second opposite side edges of the circuit board by having the circuit board moved into the space in a predetermined direction substantially parallel to the normal direction of the circuit board, the first bearing section and second bearing section being spaced from the bracing body and respectively extending from the first suspension section and the second suspension sections to collectively receive the circuit board to be positioned thereon, the first resilient bent section and the second resilient bent section being respectively located between the first and second bearing sections and the bracing body and being respectively bent from the first and second suspension sections toward each other to define a passage having a size smaller than the receiving space, whereby when the circuit board is moved in the predetermined direction substantially parallel to the normal direction of the circuit board to reach and be positioned on the first and second bearing sections, the first bearing section and the first resilient bent section resiliently clamp the first side edge of the circuit board and the second bearing section and the second resilient bent section resiliently clamp the second side edge of the circuit board so as to clamp the circuit board between the first and second suspension sections of the bracing piece.

19. A plasma display device, wherein:

the plasma display device comprises a plasma display panel and a back frame, the back frame being arranged at a back side of the plasma display panel; the back frame comprises primary assembling pieces, secondary assembling pieces, and a bracing piece for fixing a circuit board having at least one major surface defining a normal direction;

the primary assembling pieces have a number of at least two, at least one of the primary assembling pieces having an end forming a joint section, the at least two primary assembling pieces being joined through the corresponding joint sections, the secondary assembling pieces being connected to the primary assembling pieces through joining;

at least one of the primary assembling pieces comprises a reinforcement structure formed on the joint section thereof;

the at least two primary assembling pieces comprise a primary assembling piece that has a heat source arranged thereon, the primary assembling piece that has the heat source arranged thereon having a first heat transfer capability, the remaining one or more primary assembling pieces of the at least two primary assembling pieces that have no heat source arranged thereon having a second heat transfer capability, the first heat transfer capability being greater than the second heat transfer capability;

the bracing piece comprises a bracing body, a first suspension section and a second suspension section, a first bearing section and a second bearing section, and a first resilient bent section and a second resilient bent section, the bracing body being fixed to the primary assembling pieces or the secondary assembling pieces or both of the primary assembling pieces and the secondary assembling pieces; and the first suspension section and second suspension section extend from the bracing body to be spaced from and opposing each other so as to define therebetween a receiving space for receiving the circuit board therein in such a way that the first and second suspension sections respectively engage first and second opposite side edges of the circuit board by having the circuit board moved into the space in a predetermined direction substantially parallel to the normal direction of the circuit board, the first bearing section and second bearing section being spaced from the bracing body and respectively extending from the first suspension section and the second suspension sections to collectively receive the circuit board to be positioned thereon, the first resilient bent section and the second resilient bent section being respectively located between the first and second bearing sections and the bracing body and being respectively bent from the first and second suspension sections toward each other to define a passage having a size smaller than the receiving space, whereby when the circuit board is moved in the predetermined direction substantially parallel to the normal direction of the circuit board to reach and be positioned on the first and second bearing sections, the first bearing section and the first resilient bent section resiliently clamp the first side edge of the circuit board and the second bearing section and the second resilient bent section resiliently clamp the second side edge of the circuit board so as to clamp the circuit board between the first and second suspension sections of the bracing piece.

* * * * *